US012772823B2

(12) United States Patent
Xie et al.

(10) Patent No.: US 12,772,823 B2
(45) Date of Patent: Oct. 20, 2026

(54) BACKSIDE CONTACT WITH FULL WRAP-AROUND CONTACT

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Brent A. Anderson, Jericho, VT (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 509 days.

(21) Appl. No.: 17/944,437

(22) Filed: Sep. 14, 2022

(65) Prior Publication Data

US 2024/0088038 A1 Mar. 14, 2024

(51) Int. Cl.

| | |
|---|---|
| ***H10W 20/41*** | (2026.01) |
| ***H10W 20/20*** | (2026.01) |
| ***H10W 20/42*** | (2026.01) |

(52) U.S. Cl.

CPC ......... *H10W 20/427* (2026.01); *H10W 20/20* (2026.01); *H10W 20/42* (2026.01)

(58) Field of Classification Search

CPC ............. H01L 23/5286; H01L 23/5226; H01L 23/535; H10D 30/6735; H10D 30/6757; H10W 20/427; H10W 20/20; H10W 20/42; H10W 20/0696; H10W 20/069

See application file for complete search history.

(56) References Cited

U.S. PATENT DOCUMENTS

| | | | |
|---|---|---|---|
| 9,570,395 | B1 | 2/2017 | Sengupta et al. |
| 9,576,954 | B1 | 2/2017 | Greene et al. |
| 10,586,765 | B2 | 3/2020 | Smith et al. |
| 10,636,739 | B2 | 4/2020 | Beyne et al. |
| 10,658,483 | B2 | 5/2020 | Leobandung |
| 10,700,207 | B2 | 6/2020 | Chen et al. |
| 10,886,217 | B2 | 1/2021 | Morrow et al. |
| 10,950,722 | B2 | 3/2021 | Zhang et al. |
| 11,227,799 | B2 | 1/2022 | Mehandru |
| 11,264,493 | B2 | 3/2022 | Morrow et al. |
| 2020/0105671 | A1 | 4/2020 | Lai et al. |
| 2021/0111115 | A1 | 4/2021 | Morrow et al. |
| 2021/0134721 | A1 | 5/2021 | Chiang et al. |

(Continued)

FOREIGN PATENT DOCUMENTS

EP 3671825 A1 6/2020

OTHER PUBLICATIONS

Gupta et al., "Buried Power Rail Integration with Si FinFETs for CMOS Scaling beyond the 5 nm Node", In 2020 IEEE Symposium on VLSI Technology, Jun. 1, 20206 (pp. 1-2).

(Continued)

*Primary Examiner* — Shih Tsun A Chou

(74) *Attorney, Agent, or Firm* — Harrity & Harrity, LLP

(57) ABSTRACT

A semiconductor device having a source/drain having a height, a length, and a width. A full wrap-around contact surrounds a partial length of the source/drain. The full wrap-around contact includes a frontside recessed wrap-around contact from a front side of the source/drain and a backside conductive contact from a back side of the source/drain.

20 Claims, 28 Drawing Sheets

A ←-----------------→ A

B ←-----------------→ B

(56) References Cited

U.S. PATENT DOCUMENTS

| | | | | |
|---|---|---|---|---|
| 2021/0202385 | A1 | 7/2021 | Huang et al. | |
| 2021/0305252 | A1 | 9/2021 | Chiang et al. | |
| 2021/0305381 | A1 | 9/2021 | Chiang et al. | |
| 2021/0336019 | A1 | 10/2021 | Su et al. | |
| 2021/0351303 | A1 | 11/2021 | Ju et al. | |
| 2021/0376071 | A1 | 12/2021 | Liu et al. | |
| 2021/0376093 | A1 | 12/2021 | Chu et al. | |
| 2021/0399099 | A1 | 12/2021 | Chu et al. | |
| 2023/0067715 | A1* | 3/2023 | Yuh .................... | H10D 30/6729 |
| 2024/0030136 | A1* | 1/2024 | Chang ................ | H10D 30/6729 |

OTHER PUBLICATIONS

D. Prasad et al., "Buried Power Rails and Back-side Power Grids: Arm® CPU Power Delivery Network Design Beyond 5nm," 2019 IEEE International Electron Devices Meeting (IEDM), San Francisco, CA, USA, 2019, pp. 19.1.1-19.1.4, doi: 10.1109/IEDM19573.2019.8993617.

R. Mathur et al., "Buried Bitline for sub-5nm SRAM Design," 2020 IEEE International Electron Devices Meeting (IEDM), San Francisco, CA, USA, 2020, 4 pages, doi: 10.1109/IEDM13553.2020.9372042.

* cited by examiner

BACKSIDE CONTACT WITH FULL WRAP-AROUND CONTACT

BACKGROUND

The present invention generally relates to a backside contact formation to a power distribution network (BSPDN), and more particularly to a backside power rail (BPR) connection.

As a micro-through silicon via (μTSV) diameter increases, the keep-out-zone (KOZ) also increases. Through silicon vias (TSVs) can be formed during fabrication as a way of providing a conductive path through silicon.

SUMMARY

In accordance with an embodiment of the present invention, a method of forming a semiconductor device includes forming an adjacent pair of insulating dielectric sidewalls on a stack of alternating sacrificial nanosheet sections and semiconductor nanosheet layer sections, removing a portion of the sacrificial nanosheet sections and semiconductor nanosheet layer sections between the adjacent pair of insulating sidewalls and removing a portion of a buried insulating layer and an underlying active semiconductor mesa to form a mesa cavity. A sacrificial plug is formed in the mesa cavity and a source/drain is formed on the sacrificial plug, wherein insulating dielectric sidewalls are on opposite sides of the source/drain. A conductive fill layer is formed on the source/drain, and the conductive fill layer is patterned to form an frontside recessed wrap-around source/drain contact on opposite sides of the source/drain. A backside (interlevel dielectric layer) ILD layer is formed on the sacrificial plug, and the sacrificial plug and a portion of the backside ILD layer are removed to expose the bottom of the source/drain and the frontside recessed wrap-around source/drain contact. A backside conductive contact is formed on and in electrical contact with the bottom of the source/drain and the frontside recessed wrap-around source/drain contact to form a full wrap-around contact.

In accordance with another embodiment of the present invention, a semiconductor device is provided having a source/drain having a height, a length, and a width. A full wrap-around contact surrounds a partial length of the source/drain. The full wrap-around contact includes a frontside recessed wrap-around contact from a front side of the source/drain and a backside conductive contact from a back side of the source/drain.

In accordance with yet another embodiment of the present invention, a backside power connection device includes a backside power rail on a backside power delivery network (BSPDN); a backside ILD layer on the backside power rail and the backside power delivery network (BSPDN); a backside conductive contact in the backside ILD layer, wherein the backside conductive contact is in electrical contact with the backside power rail; a first source/drain on the backside conductive contact; and a frontside recessed wrap-around contact on the top and opposite sides of the first source/drain.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein, in FIGS. 2-28, reference characters A and B denote orthogonal section lines A-A and B-B, respectively.

DETAILED DESCRIPTION

Principles and embodiments of the present invention relate to forming back-side electrical connections to full wrap-around source/drain contacts. A patterned metal fill layer and a widened backside contact can form a full wrap-around source/drain contacts to improve device performance.

In one or more embodiments, a partial back-side wrap-around contact can be formed from a back side of a device and substrate. The partial back-side wrap-around contact can be directly on the source/drain and in electrical contact with the partial front-side wrap-around contact formed from the patterned metal fill.

In one or more embodiments, a sacrificial plug can be formed in source/drain regions of devices and subsequently removed to allow access to the backside of the source/drains and provide an opening to form the back-side electrical contacts.

In various embodiments, a backside power rail can connect to a source/drain of a transistor through a partial back-side wrap-around contact and partial front-side wrap-around contact.

Exemplary applications/uses to which the present invention can be applied include, but are not limited to: digital logic structures and device (e.g., gates, central processing units, etc.) and memory structures and device (e.g., static random access memory (SRAM), dynamic random access memory (DRAM), etc.).

It is to be understood that aspects of the present invention will be described in terms of a given illustrative architecture; however, other architectures, structures, substrate materials and process features and steps can be varied within the scope of aspects of the present invention.

Figure 1:
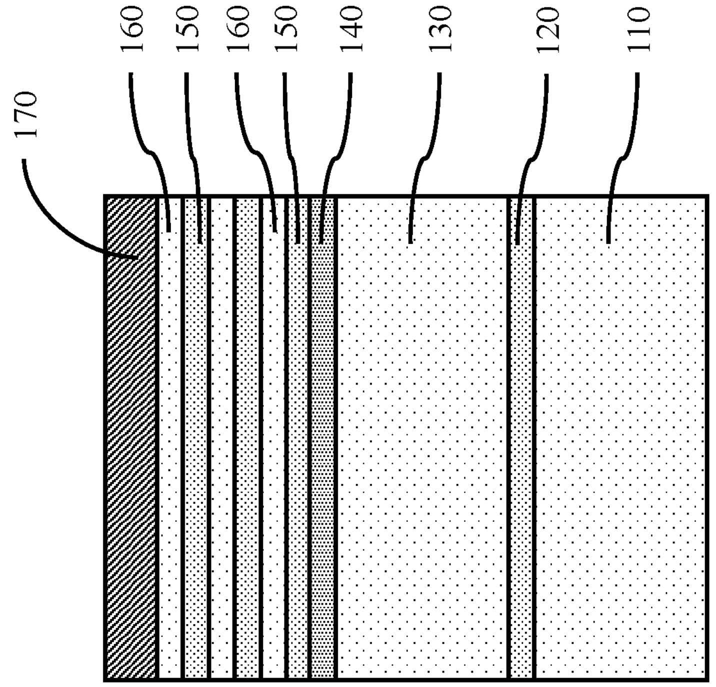
FIG. 1 is a cross-sectional side view showing alternating nanosheet layers and sacrificial layers on a substrate, in accordance with an embodiment of the present invention.

Referring now to the drawings in which like numerals represent the same or similar elements and initially to FIG. 1, FIG. 1 is a cross-sectional side view showing alternating nanosheet layers and sacrificial layers on a substrate, in accordance with an embodiment of the present invention.

In one or more embodiments, alternating sacrificial nanosheet layers 150 and semiconductor nanosheet layers 160 can be formed on a substrate 110. The sacrificial nanosheet layers 150 and semiconductor nanosheet layers 160 can be formed on a bottom sacrificial layer 140 between the sacrificial nanosheet layers 150 and semiconductor nanosheet layers 160 and an active semiconductor layer 130. A buried etch-stop layer 120 can be between the substrate 110 and the active semiconductor layer 130. In various embodiments, a masking layer 170 can be formed on the alternating sacrificial nanosheet layers 150 and semiconductor nanosheet layers 160.

In various embodiments, the substrate 110 can be a semiconductor material, for example, silicon (Si), silicon-germanium (SiGe), silicon carbide (SiC), or III-V compound semiconductor material (e.g., gallium-arsenide (GaAs)). The substrate 110 can be a semiconductor-on-insulator (SeOI) substrate, where the buried etch-stop layer 120 can be a buried electrical insulator layer (e.g., BOX layer).

In various embodiments, the buried etch-stop layer 120 can be formed on the substrate 110 or between the substrate 110 and the active semiconductor layer 130, where the buried etch-stop layer 120 can be a buried oxide layer (BOX) or a buried silicon-germanium (SiGe) partition layer.

In various embodiments, the active semiconductor layer 130 can be the same semiconductor material as the substrate 110 or a different semiconductor material formed on the buried etch-stop layer 120, for example, a semiconductor material epitaxially grown on a buried silicon-germanium partition layer.

In various embodiments, the sacrificial nanosheet layers 150 can be silicon-germanium (SiGe) layers having a germanium concentration sufficient to allow selective etching and removal relative to the semiconductor nanosheet layers 160. The semiconductor nanosheet layers 160 can be, for example, silicon (Si).

In various embodiments, the bottom sacrificial layer 140 can be silicon-germanium (SiGe) layers having a germanium concentration sufficient to allow selective etching and removal relative to the active semiconductor layer 130, semiconductor nanosheet layers 160, and the sacrificial layers 150. In various embodiments, the bottom sacrificial layer 140 can be silicon-germanium (SiGe) layer having a germanium concentration of greater than 50 atomic percent (at. %), whereas the sacrificial layers 150 can be silicon-germanium (SiGe) layer having a germanium concentration of less than 35 at. %.

In various embodiments, the masking layer 170 can be a hardmask, dielectric material, for example, silicon nitride, silicon boronitride, etc., where the masking layer 170 can have multiple layers of masking materials.

Figure 2:
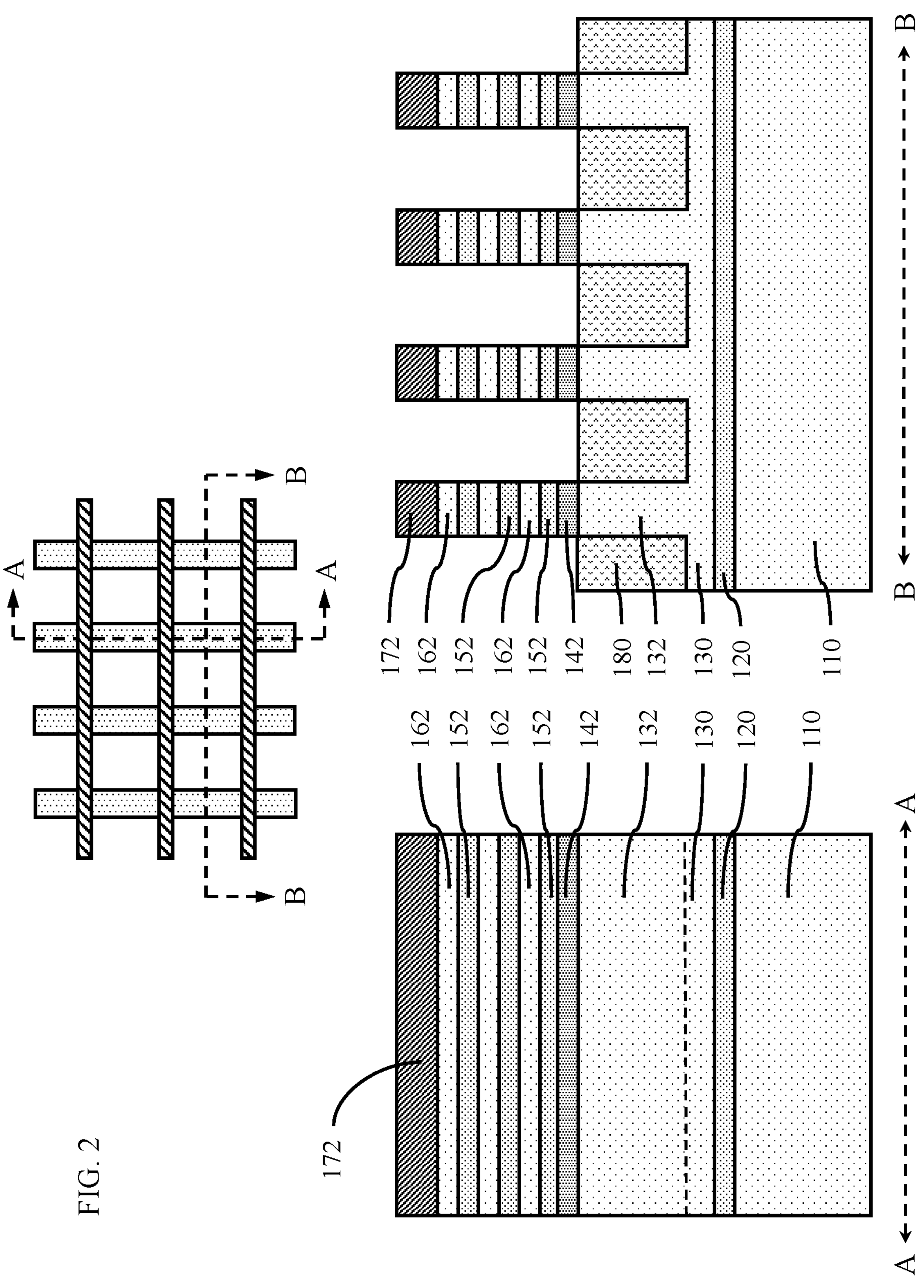
FIG. 2 shows an upper schematic plan-view orientation key in which the vertical bars correspond to patterned nanosheet stack regions 172 and the horizontal bars schematically indicate representative gate locations extending across the patterned nanosheet stack regions 172, the orientation key illustrating the locations of section lines A-A and B-B, and corresponding perpendicular cross-sectional side views taken along section lines A-A and B-B, respectively, having patterned nanosheet stacks on a substrate with intervening shallow trench isolation regions, in accordance with an embodiment of the present invention.

FIG. 2 includes perpendicular cross-sectional side views showing patterned nanosheet stacks on a substrate with intervening shallow trench isolation regions, in accordance with an embodiment of the present invention.

In one or more embodiments, the masking layer 170, sacrificial nanosheet layers 150, semiconductor nanosheet layers 160, and bottom sacrificial layer 140 can be patterned, for example, by lithography and etching (e.g., reactive ion etching (RIE)), to form nanosheet templates 172 on underlying sacrificial nanosheet sections 152 and semiconductor nanosheet layer sections 162. The bottom sacrificial layer 140 can be etched to form a bottom sacrificial section 142, and the active semiconductor layer 130 can be etched to form trenches with an active semiconductor mesa 132 beneath the bottom sacrificial section 142 and a patterned nanosheet stack of alternating sacrificial nanosheet sections 152 and semiconductor nanosheet layer sections 162.

In one or more embodiments, shallow trench isolation regions 180 can be formed adjacent to the active semiconductor mesa(s) 132, where a top surface of the shallow trench isolation regions 180 can be at or above the bottom surface of the bottom sacrificial section 142, where the top surface of the shallow trench isolation regions 180 can be at or below the middle of the bottom sacrificial section 142. The shallow trench isolation regions 180 can be formed by a deposition, planarization, and selective etch-back. In various embodiments, a portion of the active semiconductor layer 130 can remain between the bottom surface of the shallow trench isolation regions 180 and the top surface of the buried etch-stop layer 120, where the etching of the active semiconductor layer 130 does not extend all the way down to the buried etch-stop layer 120.

In various embodiments, the shallow trench isolation regions 180 can be formed of an electrically insulating dielectric material, for example, silicon oxide ($SiO_x$), silicon oxynitride (SiON), and combinations thereof.

Figure 3:
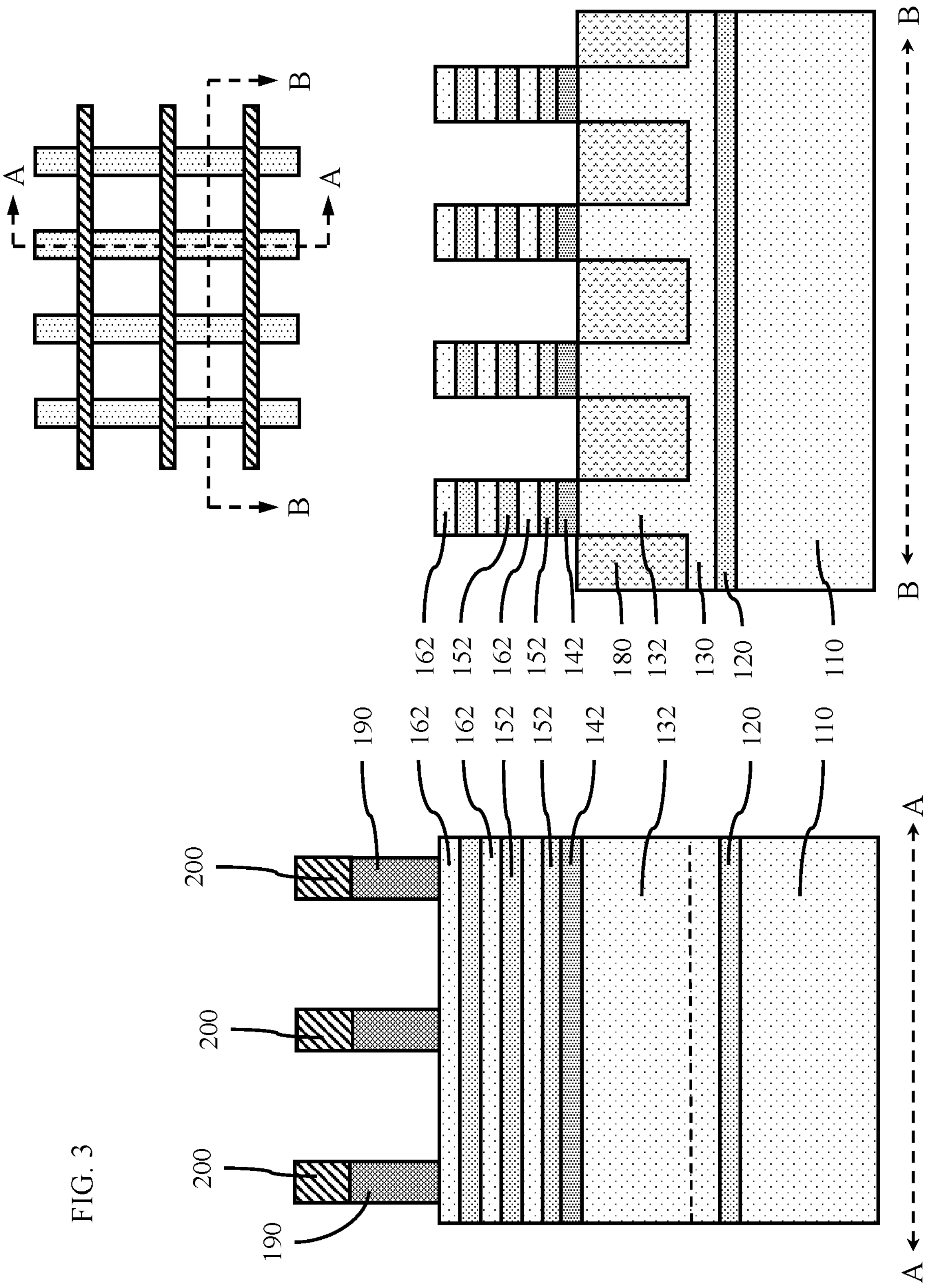
FIG. 3 shows an upper schematic plan-view orientation key in which the vertical bars correspond to nanosheet stack regions and the horizontal bars correspond to dummy gate structures 190, the orientation key illustrating the locations of section lines A-A and B-B, and corresponding perpendicular cross-sectional side views taken along section lines A-A and B-B, respectively, having dummy gate structures with gate templates formed across the nanosheet stacks, in accordance with an embodiment of the present invention.

FIG. 3 includes perpendicular cross-sectional side views showing dummy gate structures with gate templates formed across the nanosheet stacks, in accordance with an embodiment of the present invention.

In one or more embodiments, the nanosheet templates 172 can be selectively removed to expose the underlying nanosheet stack.

In one or more embodiments, dummy gate structures 190 and a dummy gate cap 200 can be formed on the stack(s) of alternating sacrificial nanosheet sections 152 and semiconductor nanosheet layer sections 162. One or more dummy gate structures 190 can be formed on the stack of alternating sacrificial nanosheet sections 152 and semiconductor nanosheet layer sections 162, for example, by forming and patterning a dummy gate layer through lithography and etching.

In various embodiments, the dummy gate structures 190 can be, for example, amorphous silicon (a-Si), amorphous carbon (a-C), and combinations thereof. In various embodiments, the dummy gate cap 200 can be, for example, silicon nitride (SiN), silicon boro carbonitride (SiBCN), silicon oxy carbide (SiCO), silicon oxy carbonitride (SiOCN), and combinations thereof.

Figure 4:
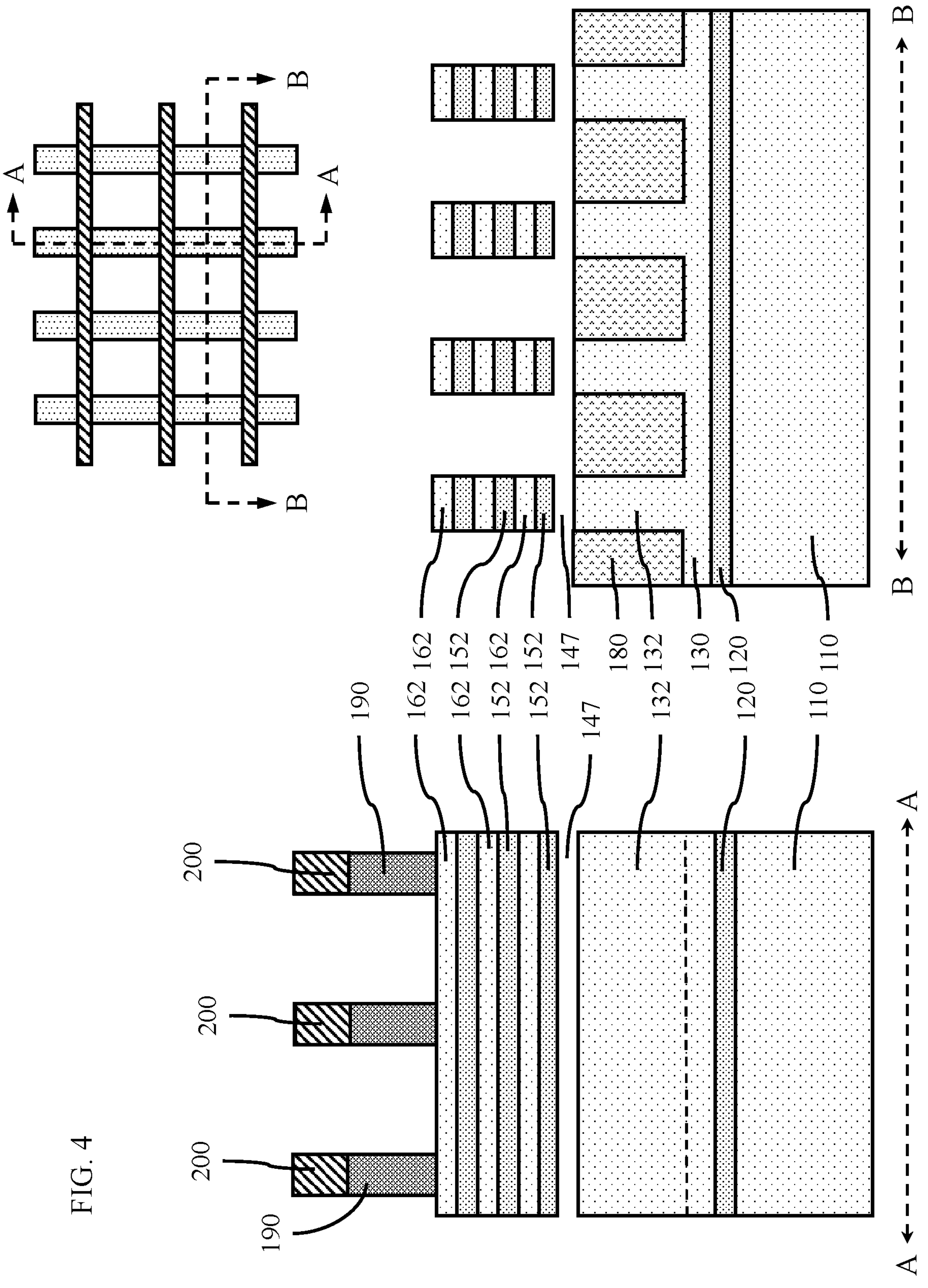
FIG. 4 shows an upper schematic plan-view orientation key in which the vertical bars correspond to nanosheet stack regions and the horizontal bars correspond to dummy gate structures 190, the orientation key illustrating the locations of section lines A-A and B-B, and corresponding perpendicular cross-sectional side views taken along section lines A-A and B-B, respectively, having the sacrificial layer beneath the nanosheet stacks removed, in accordance with an embodiment of the present invention.

FIG. 4 includes perpendicular cross-sectional side views showing removal of the sacrificial layer beneath the nanosheet stacks, in accordance with an embodiment of the present invention.

In one or more embodiments, the bottom sacrificial section(s) 142 can be selectively removed, for example, using a selective isotropic etch (e.g., wet chemical etch) that can form a channel 147 beneath the nanosheet stack of alternating sacrificial nanosheet sections 152 and semiconductor nanosheet layer sections 162.

Figure 5:
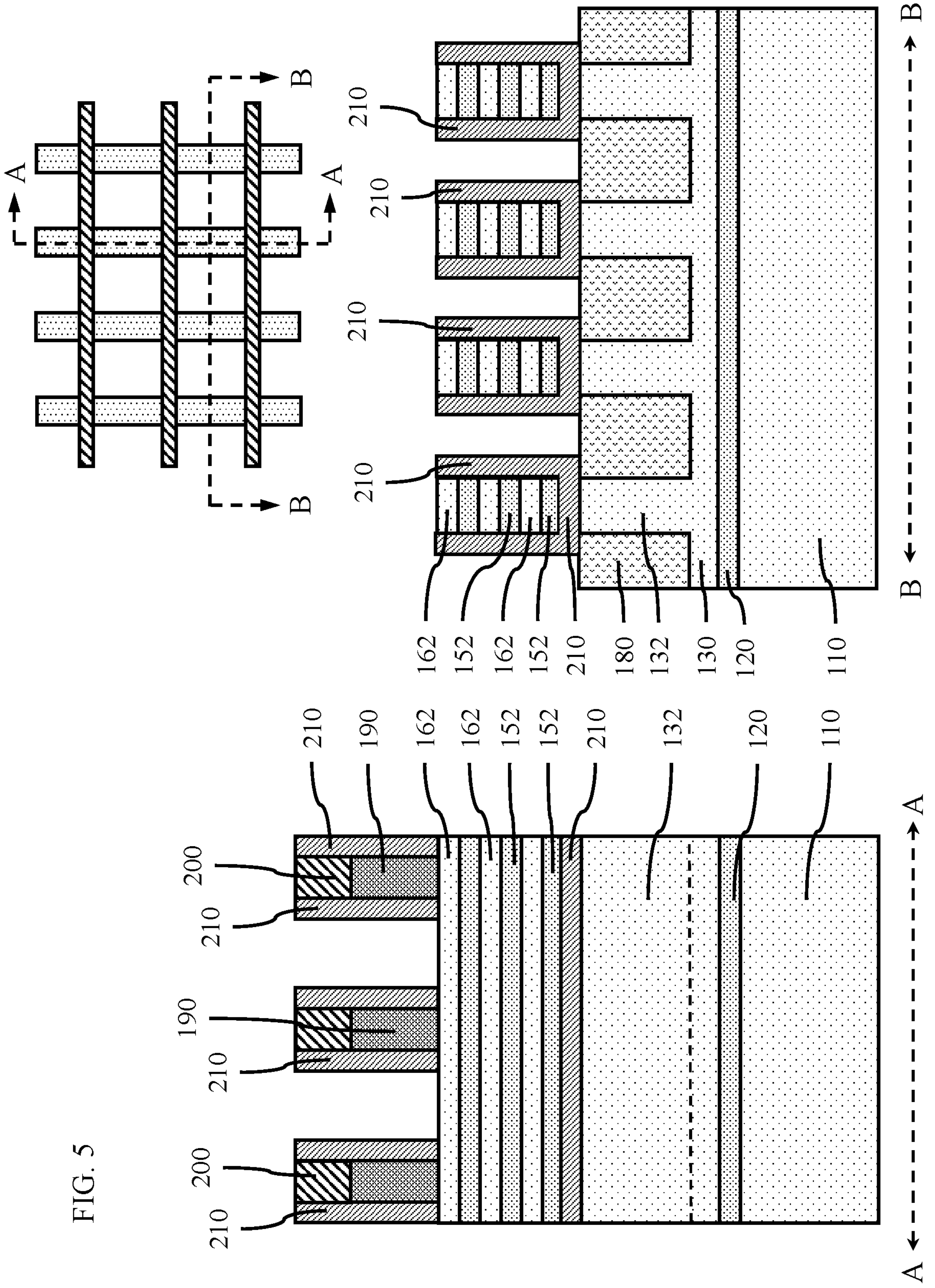
FIG. 5 shows an upper schematic plan-view orientation key in which the vertical bars correspond to nanosheet stack regions and the horizontal bars correspond to dummy gate structures 190, the orientation key illustrating the locations of section lines A-A and B-B, and corresponding perpendicular cross-sectional side views taken along section lines A-A and B-B, respectively having insulating dielectric sidewalls formed on the nanosheet stacks and a buried insulating layer replacing the bottom sacrificial layer beneath the nanosheet stacks, in accordance with an embodiment of the present invention.

FIG. 5 includes perpendicular cross-sectional side views showing insulating dielectric sidewalls formed on the nanosheet stacks and a buried insulating layer replacing the bottom sacrificial layer beneath the nanosheet stacks, in accordance with an embodiment of the present invention.

In one or more embodiments, a buried insulating layer 210 can be formed in the channels 147, and insulating dielectric sidewalls 210 can be formed on the dummy gate structures 190 and dummy gate caps 200, where the insulating dielectric sidewalls and buried insulating layer can be formed as a single layer by a conformal deposition (e.g., atomic layer deposition (ALD)), and an etch-back performed to remove portions of the insulating layer between the stacks and dummy gate structures. The top-most layer of the stack can be exposed between the insulating dielectric sidewalls 210, and a top surface of the shallow trench isolation regions 180 can be exposed.

In various embodiments, the buried insulating layer and insulating dielectric sidewalls 210 can be, for example, silicon nitride (SiN), silicon boro carbonitride (SiBCN), silicon oxy carbide (SiCO), silicon oxy carbonitride (SiOCN), and combinations thereof.

Figure 6:
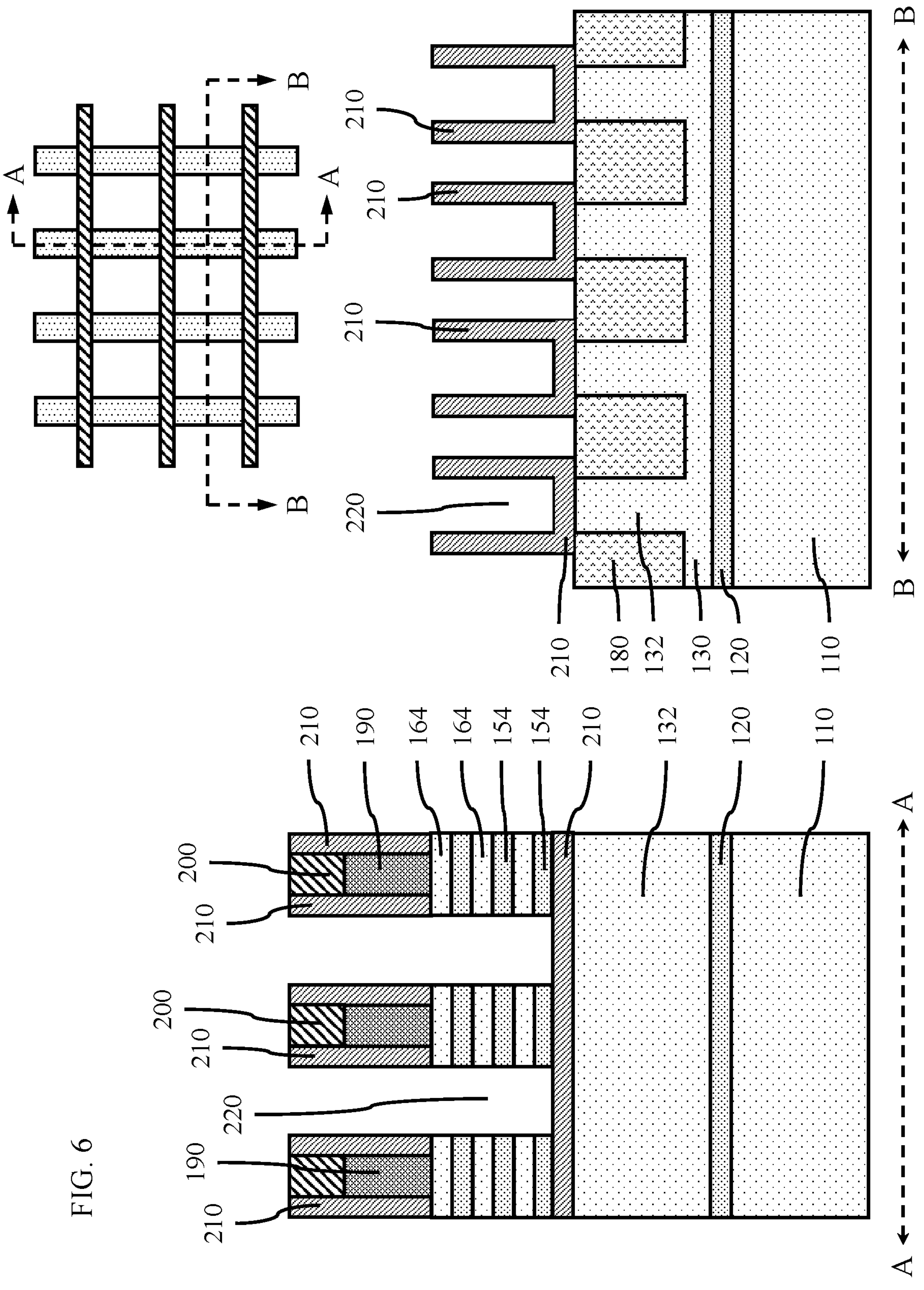
FIG. 6 shows an upper schematic plan-view orientation key in which the vertical bars correspond to nanosheet stack regions and the horizontal bars correspond to dummy gate structures 190, the orientation key illustrating the locations of section lines A-A and B-B, and corresponding perpendicular cross-sectional side views taken along section lines A-A and B-B, respectively, having the nanosheet stacks partitioned into nanosheet segments, in accordance with an embodiment of the present invention.

FIG. 6 includes perpendicular cross-sectional side views showing the nanosheet stacks partitioned into nanosheet segments, in accordance with an embodiment of the present invention.

In various embodiments, portions of the sacrificial nanosheet sections 152 and semiconductor nanosheet layer sections 162 can be exposed between the insulating dielectric sidewalls 210 on the dummy gate structure 190. The exposed portions of the sacrificial sections 152 and nanosheet layer sections 162 can be removed using a selective directional etch (e.g., RIE) to form a stack of alternating sacrificial nanosheet segments 154 and semiconductor nanosheet layer segments 164. Removal of the exposed portions of the sacrificial nanosheet sections 152 and semiconductor nanosheet layer sections 162 can expose a portion of the buried insulating layer 210, which can be removed using a selective isotropic etch (e.g., RIE) to expose the underlying portion of the active semiconductor mesa 132 between the dummy gate structures.

Removal of the portions of the sacrificial nanosheet sections 152 and semiconductor nanosheet layer sections 162 can leave U-shaped sections of the insulating dielectric sidewalls and buried insulating layer 210 exposed between the dummy gate structures forming channels 220 between the alternating sacrificial nanosheet segments 154 and semiconductor nanosheet layer segments 164.

Figure 7:
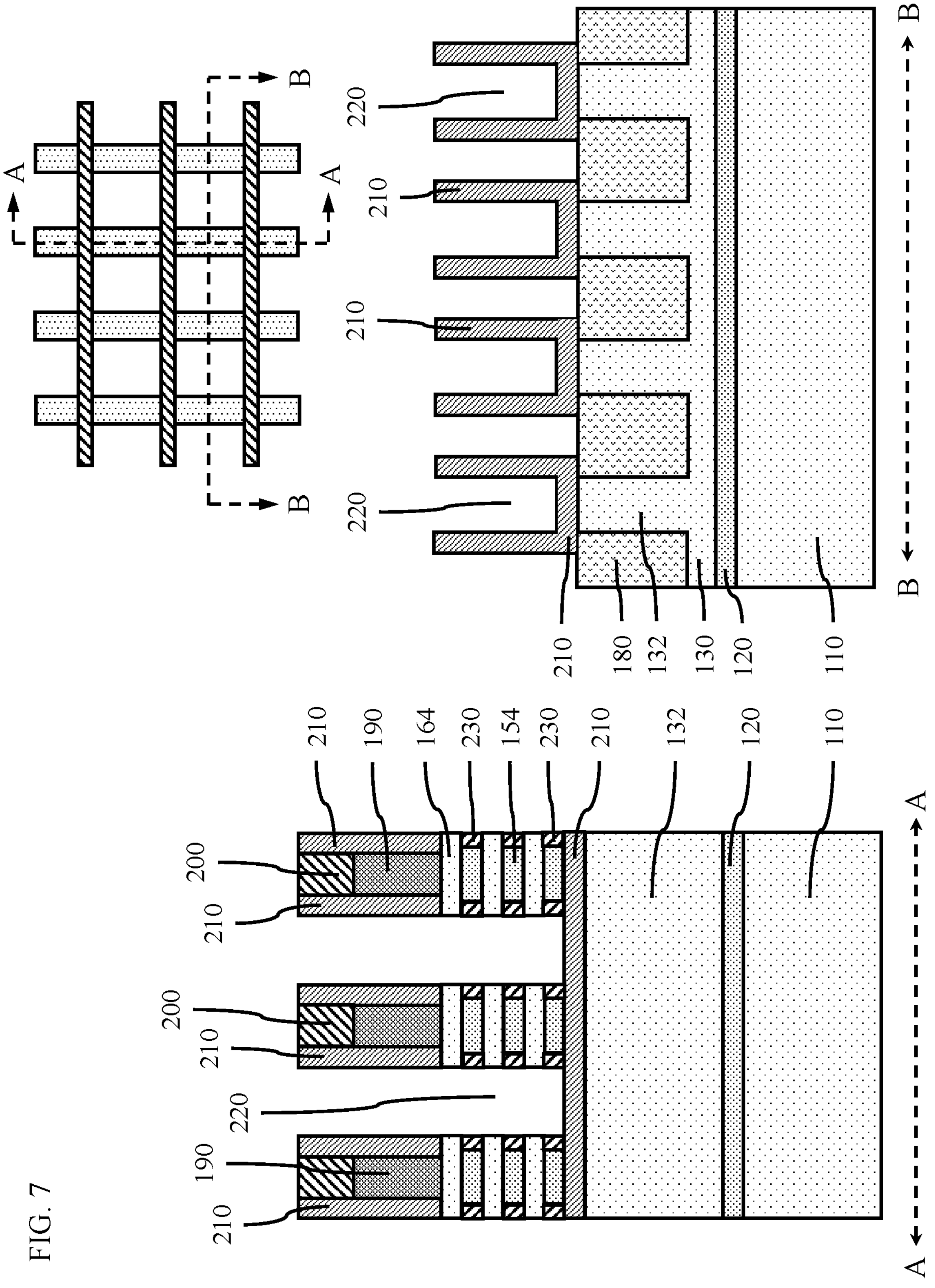
FIG. 7 shows an upper schematic plan-view orientation key in which the vertical bars correspond to nanosheet stack regions and the horizontal bars correspond to dummy gate structures 190, the orientation key illustrating the locations of section lines A-A and B-B, and corresponding perpendicular cross-sectional side views taken along section lines A-A and B-B, respectively, having the removal of a portion of the sacrificial nanosheet layers and formation of inner spacers in the recesses, in accordance with an embodiment of the present invention.

FIG. 7 includes perpendicular cross-sectional side views showing the removal of a portion of the sacrificial nanosheet layers and formation of inner spacers in the recesses, in accordance with an embodiment of the present invention.

In various embodiments, a portion of each of the alternating sacrificial nanosheet segments 154 can be removed to form recesses, where a dielectric insulating material can be formed in the recesses to form inner spacers 230. The inner spacers 230 can be formed by a conformal deposition (e.g., ALD), and an isotropic etch-back that leaves dielectric insulating material in the channels.

In various embodiments, the inner spacers 230 can be a dielectric insulating material, including, but not limited to, silicon nitride (SiN), silicon boro carbonitride (SiBCN), silicon oxy carbide (SiCO), silicon oxy carbonitride (SiOCN), and combinations thereof. In various embodiments, inner spacers 230 can be the same material as the insulating dielectric sidewalls 210.

Figure 8:
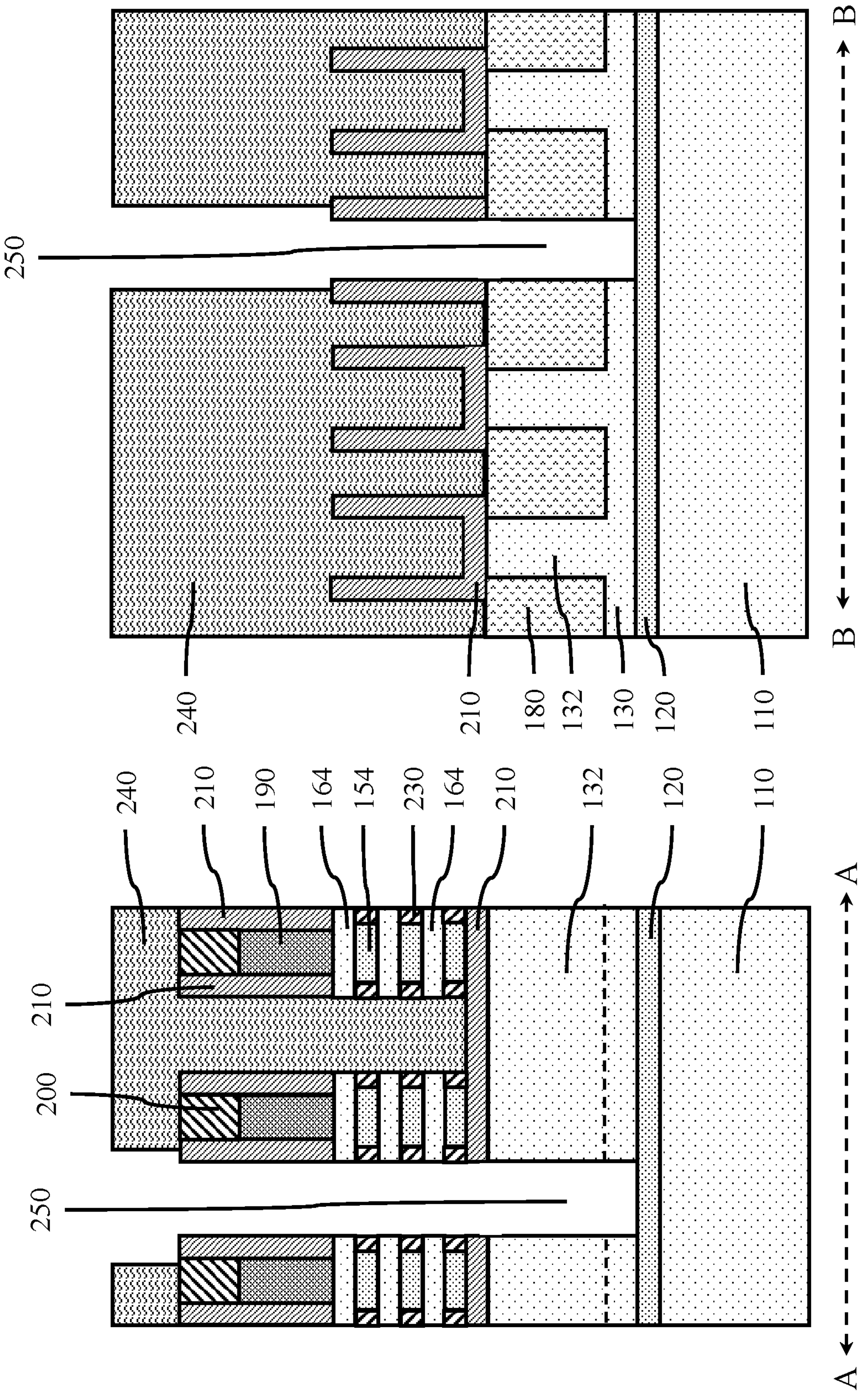
FIG. 8 shows perpendicular cross-sectional side views having a portion of the buried insulating layer and underlying active semiconductor layer removed to form a trench to the buried etch-stop layer, in accordance with an embodiment of the present invention.

FIG. 8 includes perpendicular cross-sectional side views showing removal of a portion of the buried insulating layer and underlying active semiconductor layer to form cavities to the buried etch-stop layer, in accordance with an embodiment of the present invention.

In various embodiments, a patterning layer 240 can be formed over the dummy gate caps 200, insulating dielectric sidewalls 210, and shallow trench isolation regions 180, and fill in the channels 220. The patterning layer 240 can be an organic planarization layer (OPL), a silicon oxide ($SiO_x$), and combinations thereof. Openings can be formed in the patterning layer 240 through lithography and etching to expose underlying areas where a mesa cavity 250 can be formed.

In various embodiments, the portion of the buried insulating layer 210 exposed at the bottom of the channel 220 can be removed using a selective directional etch (e.g., RIE) to expose the underlying portion of the active semiconductor mesa 132, while leaving the insulating dielectric sidewalls 210.

In various embodiments, a portion of the active semiconductor mesa 132 can be removed to form mesa cavities 250. A portion of the active semiconductor mesa 132 can be removed from between shallow trench isolation regions 180, and between the semiconductor mesa segments 134. A portion of the active semiconductor mesa 132 can remain beneath the shallow trench isolation regions 180. Removal of the portions of the active semiconductor mesa 132 can stop at and expose the underlying buried etch-stop layer 120.

In various embodiments, portions of the insulating sidewalls 210 can be on the shallow trench isolation regions 180.

Figure 9:
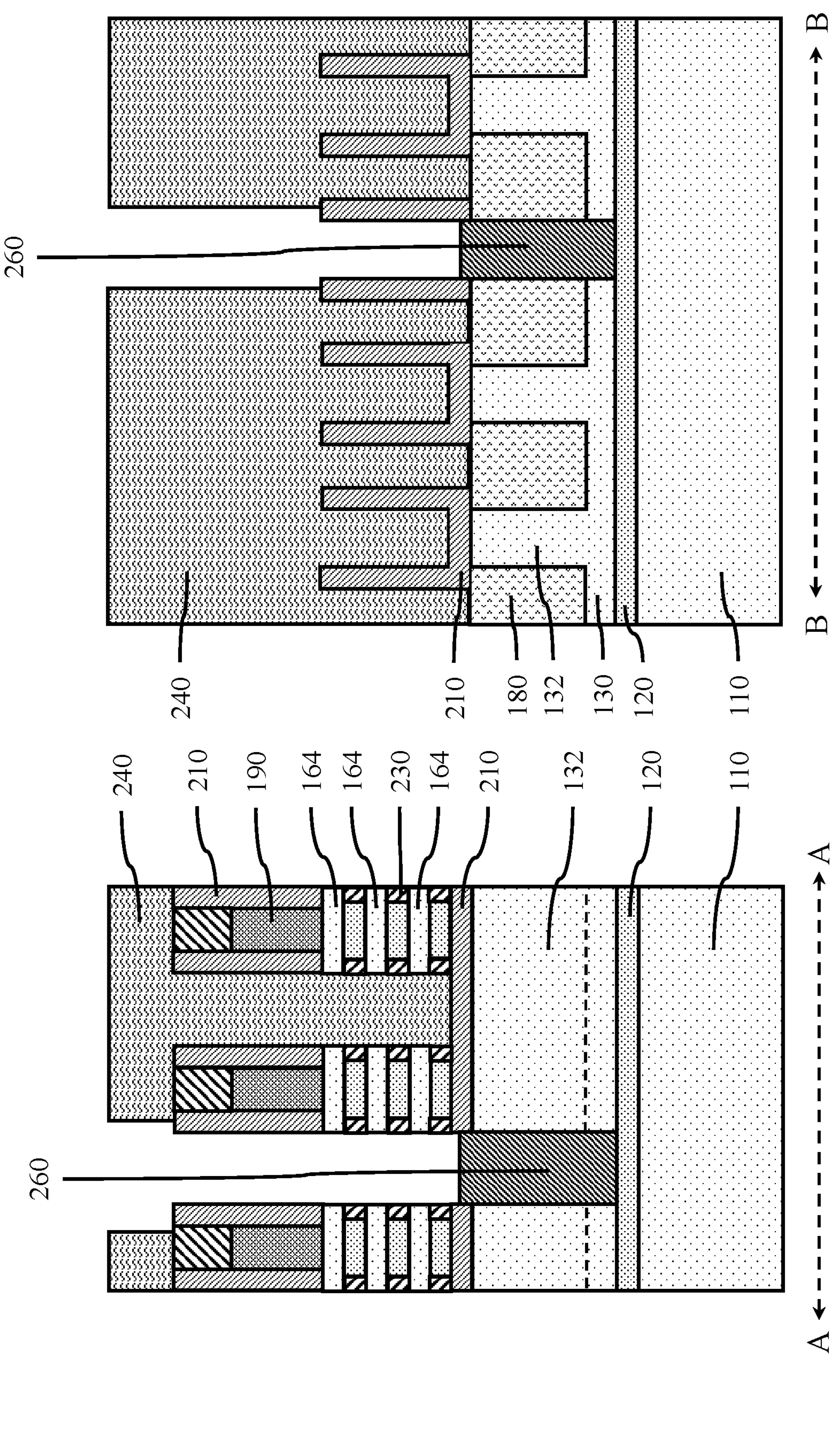
FIG. 9 shows perpendicular cross-sectional side views having the formation of sacrificial plugs between the nanosheet segments and isolation regions, in accordance with an embodiment of the present invention.

FIG. 9 are perpendicular cross-sectional side views showing the formation of sacrificial plugs between the nanosheet segments and isolation regions, in accordance with an embodiment of the present invention.

In one or more embodiments, a sacrificial plug 260 can be formed in each of the mesa cavities 230 between the semiconductor mesa segments 134 and between the shallow trench isolation regions 180, where the sacrificial plugs 260 can be formed by a deposition and etch-back, or selective bottom-up growth process. The top surface of the sacrificial plugs 260 can be at or above the top surface of the shallow trench isolation regions 180 and between the top and bottom surfaces of the buried insulating layer 210.

In various embodiments, the top surface(s) of the sacrificial plugs 260 can extend above the top surfaces of the shallow trench isolation regions 180, and cover a lower portion of the inside sidewalls of the insulating dielectric sidewalls 210.

In various embodiments, the sacrificial plugs 260 can be made of an insulating dielectric material, including, but not limited to, aluminum oxide (AlO), titanium oxide (TiO), a semiconductor material, including, but not limited to, silicon carbide (SiC), silicon germanium (SiGe), and combinations thereof, where the sacrificial plugs 260 can be selectively removed relative to the semiconductor mesa segments 134, shallow trench isolation regions 180, the insulating dielectric sidewalls 210, and the buried insulating layer 210.

Figure 10:
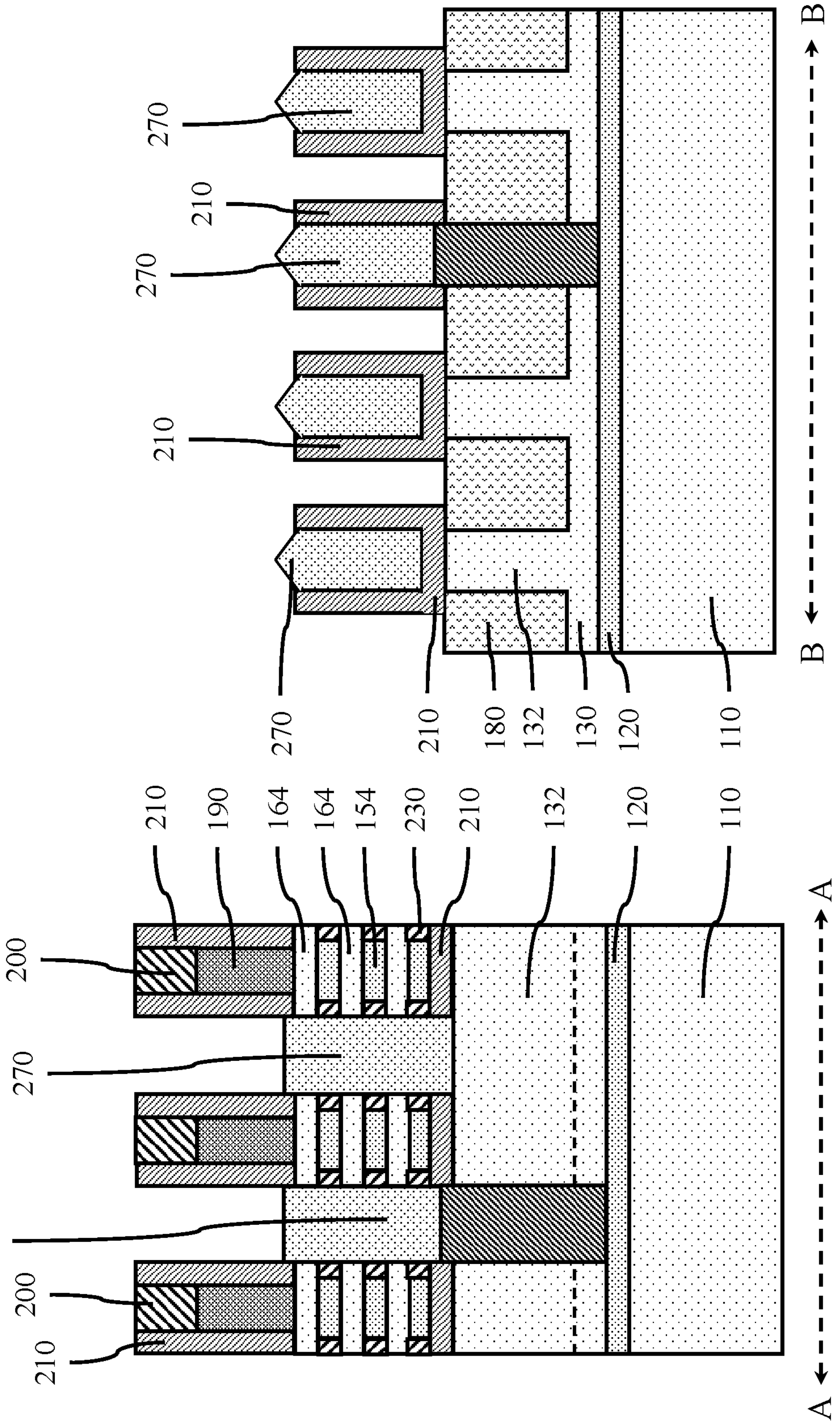
FIG. 10 shows perpendicular cross-sectional side views having source/drains formed on the sacrificial plugs and buried dielectric layer, in accordance with an embodiment of the present invention.

FIG. 10 includes perpendicular cross-sectional side views showing source/drains formed on the sacrificial plugs and buried dielectric layer, in accordance with an embodiment of the present invention.

In one or more embodiments, the patterning layer 240 can be removed by ashing and/or a selective etch based on the materials used for the patterning layer 240. Removal of the patterning layer 240 can expose the channels 220 between the sacrificial nanosheet segments 154 and semiconductor nanosheet layer segments 164.

In one or more embodiments, source/drains 270 can be formed on the sacrificial plug 260 and between adjacent sacrificial nanosheet segments 154 and semiconductor nanosheet layer segments 164, where the source/drains 270 can be formed by lateral epitaxial growth from the exposed sides of the semiconductor nanosheet layer segments 164. The inner spacers 230 can electrically separate the sacrificial nanosheet segments 154 from the source/drains 270.

In various embodiments, a portion of the insulating dielectric sidewalls 210 can cover the sidewalls of the source/drains 270. The source/drains 270 can extend above the tops of the insulating dielectric sidewalls 210 and uppermost sacrificial nanosheet segments 154 or semiconductor nanosheet layer segments 164. The buried insulating layer 210 can electrically separate the source/drains 270 from the active semiconductor mesas 132.

Figure 11:
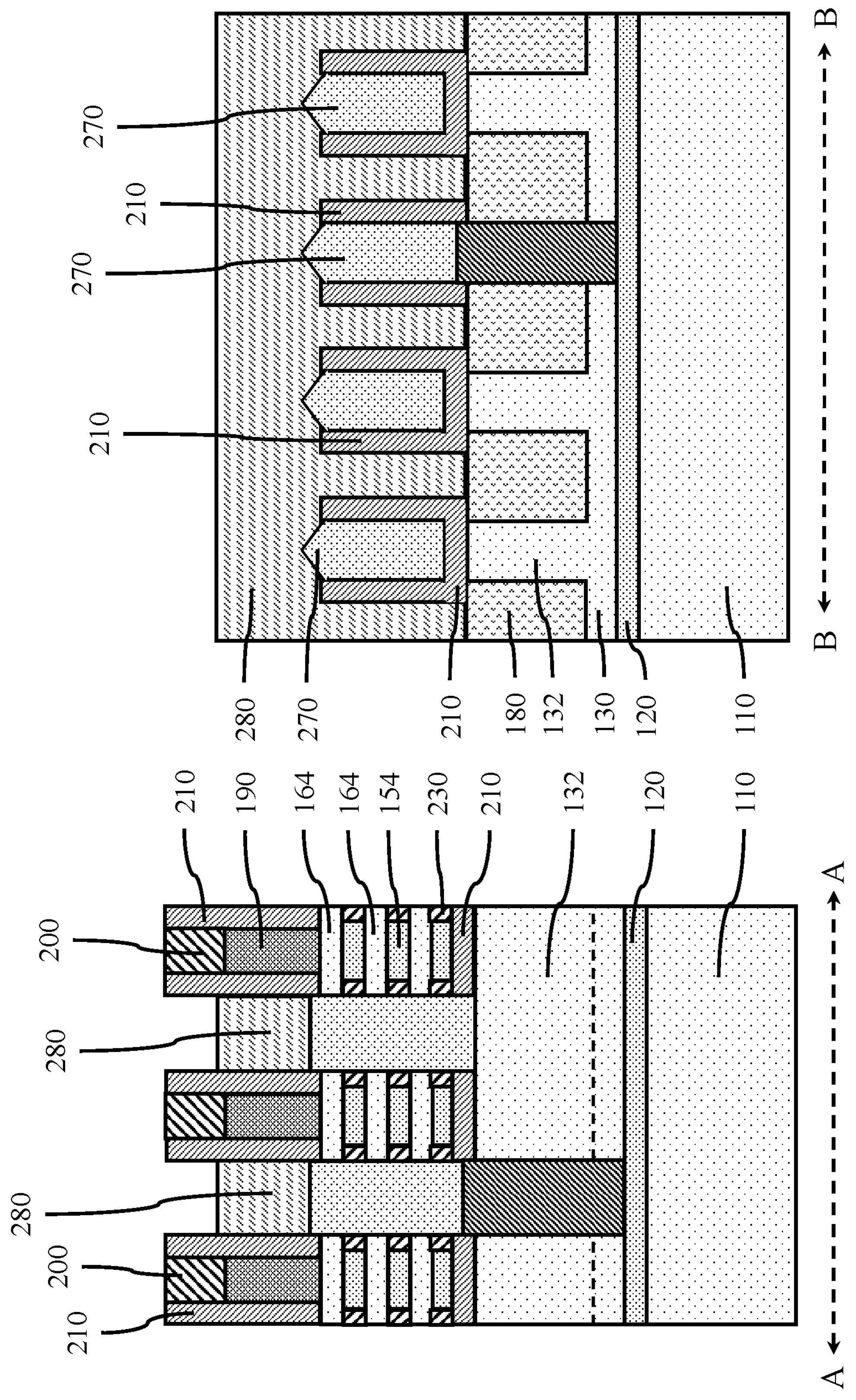
FIG. 11 shows perpendicular cross-sectional side views having a dielectric gage layer formed on the source/drains, in accordance with an embodiment of the present invention.

FIG. 11 includes perpendicular cross-sectional side views showing a dielectric gage layer formed on the source/drains, in accordance with an embodiment of the present invention.

In one or more embodiments, a sacrificial dielectric gage layer 280 can be formed on the source/drains 270, remaining portions of the insulating dielectric sidewalls 210, and dummy gate caps 200 on different regions of the substrate, where the dielectric gage layer 280 can be formed by a blanket deposition (e.g., spin-on coating OPL). The dielectric gage layer 280 can fill in the spaces between the insulating dielectric sidewalls 210 and above the source/drains 270. The dielectric gage layer 280 can be etched back below the top surfaces of the dummy gate caps 200, but above the top surfaces of the dummy gate structures 190.

Figure 12:
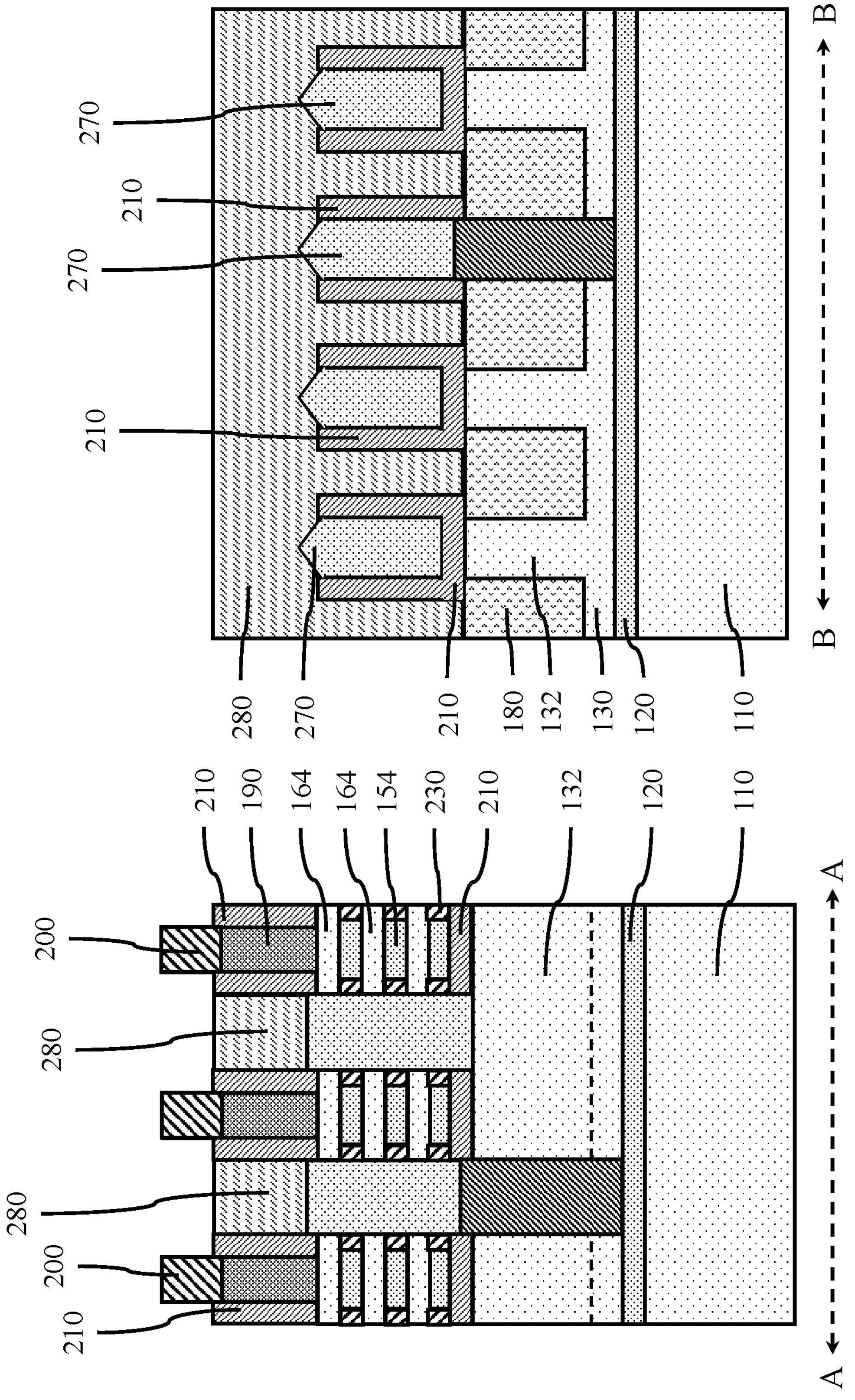
FIG. 12 shows perpendicular cross-sectional side views having the insulating dielectric sidewalls partially removed from the dummy gate caps, in accordance with an embodiment of the present invention.

FIG. 12 are perpendicular cross-sectional side views showing the insulating dielectric sidewalls partially removed from the dummy gate caps, in accordance with an embodiment of the present invention.

In one or more embodiments, the insulating dielectric sidewalls 210 exposed by removal of the portion(s) of the dielectric gage layer 280 can be removed using a selective etch to expose an upper portion of the dummy gate caps 200.

Figure 13:
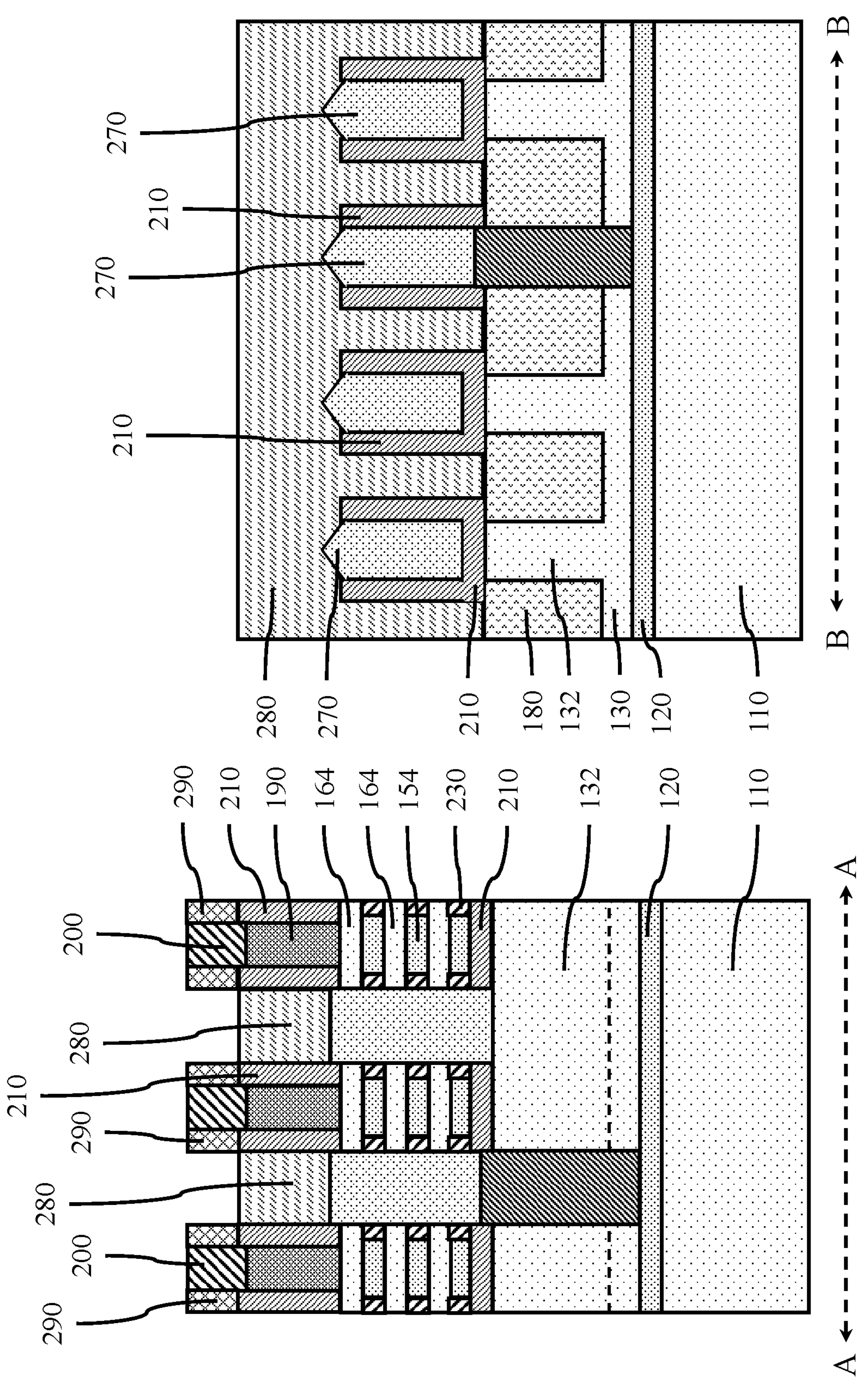
FIG. 13 shows perpendicular cross-sectional side views having protective spacers formed above the insulating dielectric sidewalls, in accordance with an embodiment of the present invention.

FIG. 13 includes perpendicular cross-sectional side views showing protective spacers formed above the insulating dielectric sidewalls, in accordance with an embodiment of the present invention.

In one or more embodiments, protective spacers 290 can be formed above the insulating dielectric sidewalls 210, where the protective spacers 290 can be formed by a conformal deposition (e.g., ALD) and a selective directional etch (e.g., RIE). The protective spacers 290 can cover the top surfaces of the insulating dielectric sidewalls 210 and side surfaces of the dummy gate caps 200.

In various embodiments, the protective spacers 290 can be made of an insulating dielectric material, including, but not limited to, aluminum nitride (AlN), aluminum oxide (AlO), titanium oxide (TiO), silicon carbide (SiC), and combinations thereof.

Figure 14:
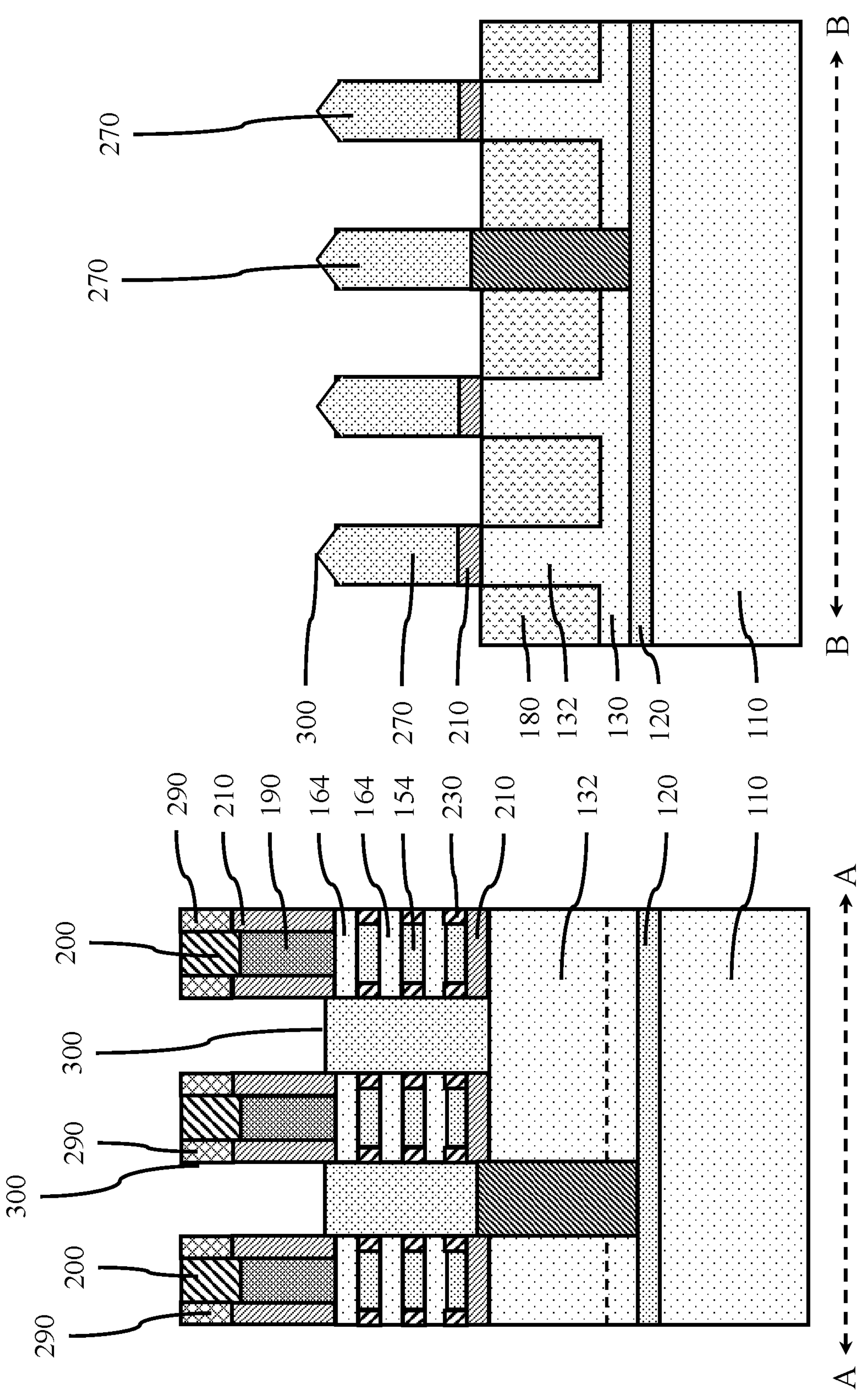
FIG. 14 shows perpendicular cross-sectional side views having removal of the dielectric gage layer, and etching down the sidewall spacer next to the S/D epi, in accordance with an embodiment of the present invention.

FIG. 14 includes perpendicular cross-sectional side views showing removal of the dielectric gage layer, and etching down the sidewall spacer 210 next to the S/D epi 270, in accordance with an embodiment of the present invention.

In one or more embodiments, the dielectric gage layer 280 can be removed using a conventional ash process, followed by directional sidewall spacer 210 etch. The spacer 210 at sidewall of S/D epi is being pulled down, and spacer 210 at sidewall of gate 190 is protected by protective spacer 290.

Figure 15:
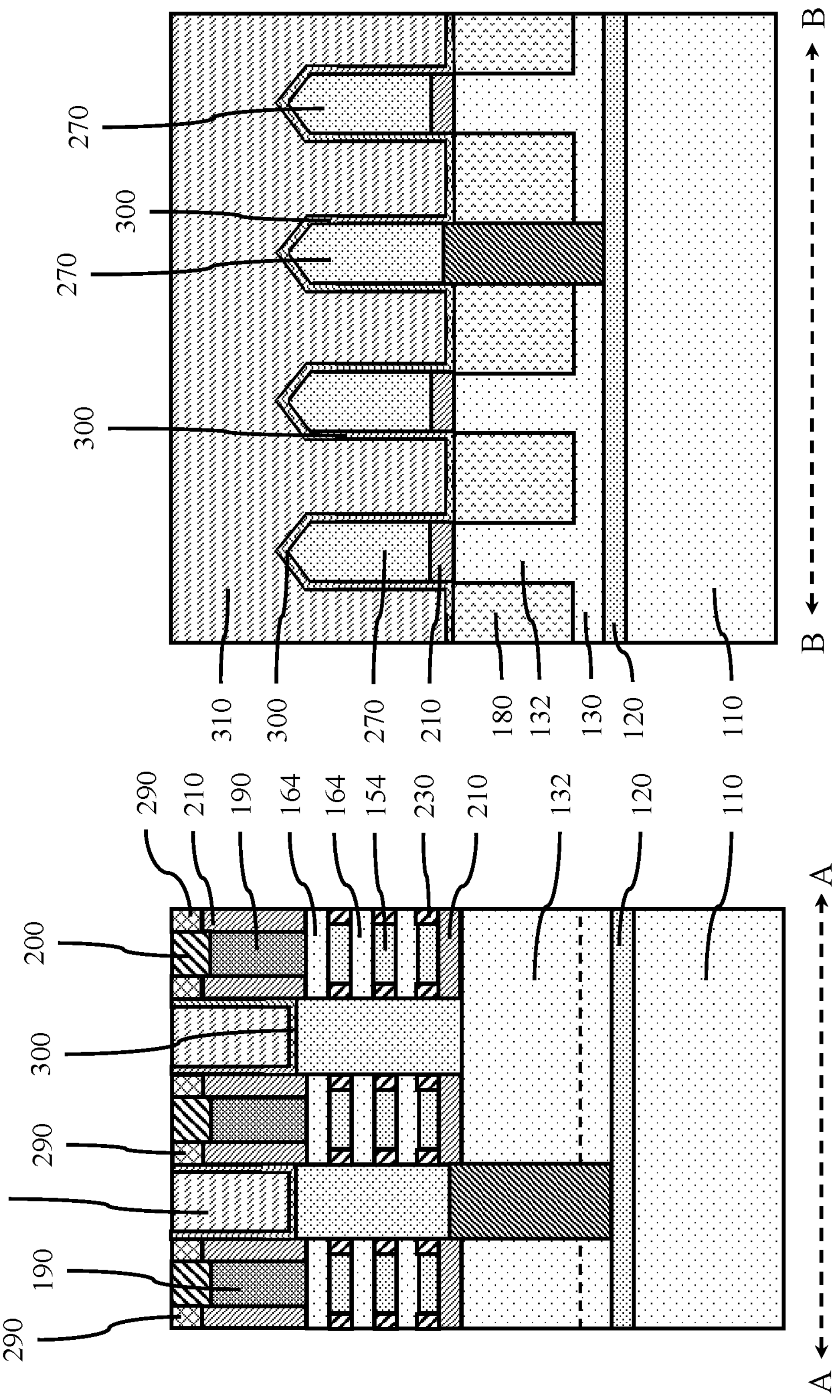
FIG. 15 shows perpendicular cross-sectional side views having an etch stop liner and an interlayer dielectric (ILD) layer on the liner layer and source/drains, in accordance with an embodiment of the present invention.

FIG. 15 includes perpendicular cross-sectional side views showing formation of an etch stop liner and an interlayer dielectric (ILD) layer on the liner layer and source/drains, in accordance with an embodiment of the present invention.

In one or more embodiments, an etch stop liner 300 and an interlayer dielectric (ILD) layer 310 can be formed on the source/drains 270, where the interlayer dielectric (ILD) layer 310 can be formed by a blanket deposition (e.g., chemical vapor deposition (CVD)). The etch stop liner can be, e.g SiN, SiBCN, SiOCN, SiOC, SiC, etc, with thickness ranging from 1 nm to 5 nm. The ILD material can be $SiO_2$, or low-k dielectrics.

In various embodiments, a portion of the ILD layer 310, dummy gate caps 200, protective spacers 290, and liner layer 300 can be removed using a CMP to provide a smooth, flat surface.

Figure 16:
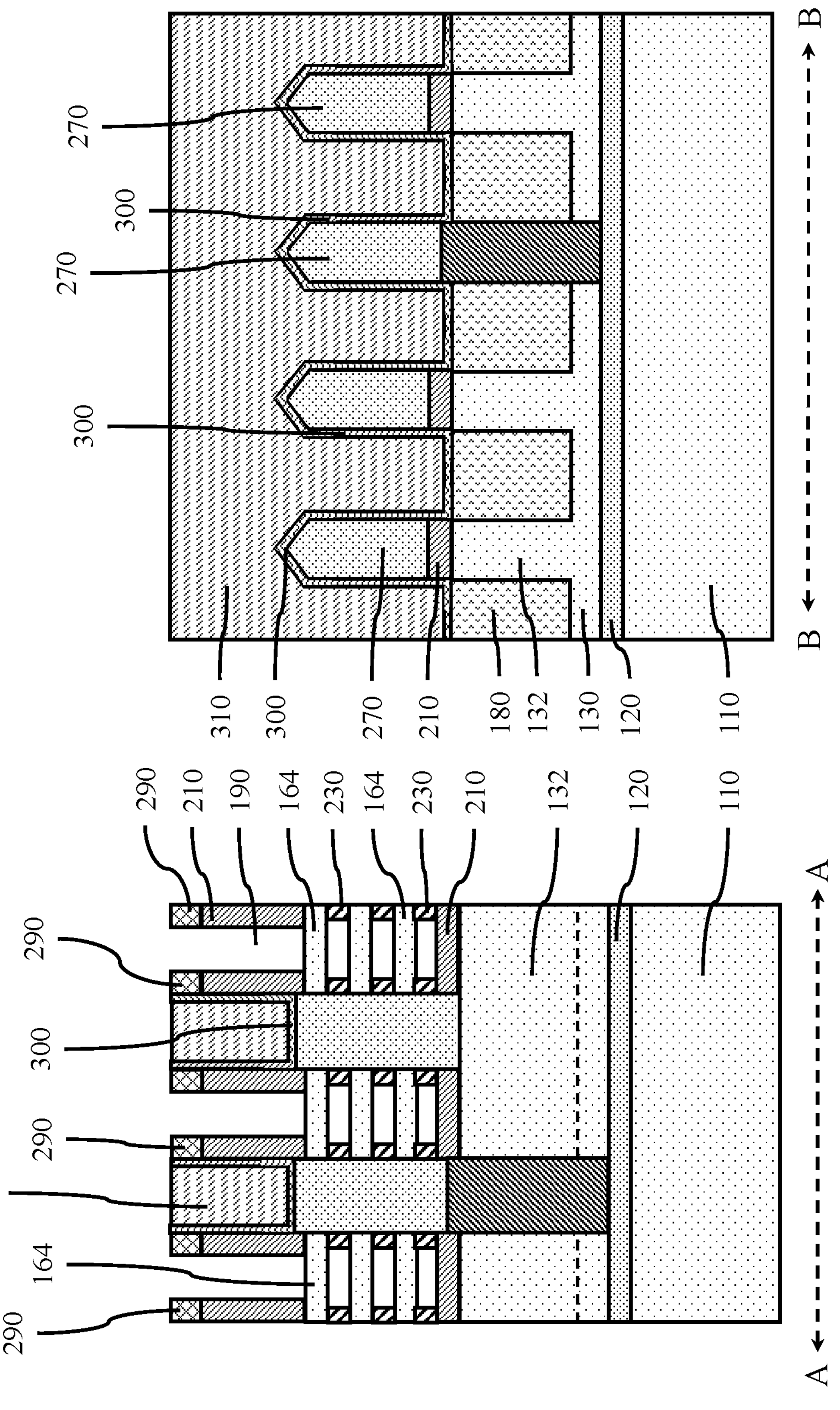
FIG. 16 shows perpendicular cross-sectional side views having removal of the dummy gates and sacrificial nanosheet segments, in accordance with an embodiment of the present invention.

FIG. 16 includes perpendicular cross-sectional side views showing removal of the dummy gates and sacrificial nanosheet segments, in accordance with an embodiment of the present invention.

In one or more embodiments, the dummy gate caps 200 and dummy gate structures 190 can be removed using selective etches to expose the surfaces of the semiconductor nanosheet layer segments 164.

In one or more embodiments, the exposed sacrificial nanosheet segments 154 can be removed using selective, isotropic etches (e.g., wet chemical etch) to expose the surfaces of the semiconductor nanosheet layer segments 164 and an underlying portion of the buried insulating layer 210. Portions of the nanosheet layer segments 164 may remain adjoining the source/drains 270 and separated by the inner spacers 230.

Figure 17:
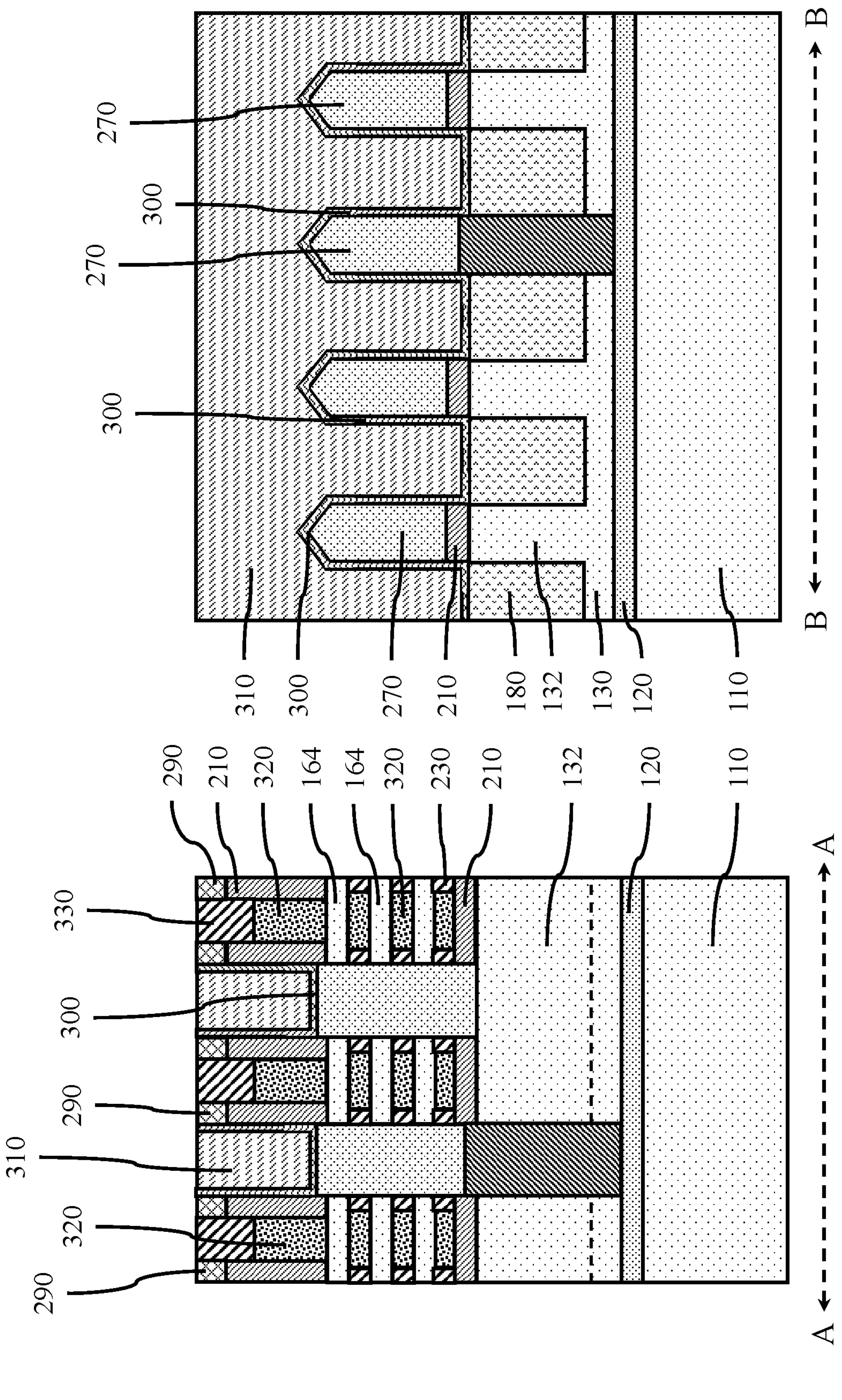
FIG. 17 shows perpendicular cross-sectional side views having an active gate structure formed, in accordance with an embodiment of the present invention.

FIG. 17 includes perpendicular cross-sectional side views showing formation of an active gate structure, in accordance with an embodiment of the present invention.

In one or more embodiments, replacement metal gate structures 320 can be formed in the spaces created by removal of the dummy gate structures 190 and sacrificial nanosheet segments 154, where the replacement metal gate structures 320 can be formed by conformal deposition (e.g., ALD). In various embodiments, the replacement metal gate structures 320 can include a gate dielectric layer and a conductive gate fill. The gate dielectric layer can be formed on the semiconductor nanosheet layer segments 164 using a conformal deposition (e.g., ALD). A conductive gate fill can be formed on the gate dielectric layer, where the conductive gate fill can include a work function layer formed on the gate dielectric layer and a conductive gate electrode formed on the work function layer.

In various embodiments, the gate dielectric layer can be a high-k dielectric material, and the conductive gate fill can be, for example, a metal having an intended conductance and/or work function, for example, TiN, TiAl, TiC, TiAlC, tungsten (W), Al, Ru, etc.

The inner spacers 230 can electrically separate the replacement metal gate structures 320 from the source/drains 270, and the buried insulating layer 210 can separate the replacement metal gate structures 320 from the semiconductor mesas 132.

In various embodiments, gate caps 330 can be formed between the insulating dielectric sidewalls 210 on the replacement metal gate structures 320, where the gate caps 330 can be an electrically insulating dielectric material, for example, silicon nitride (SiN).

Figure 18:
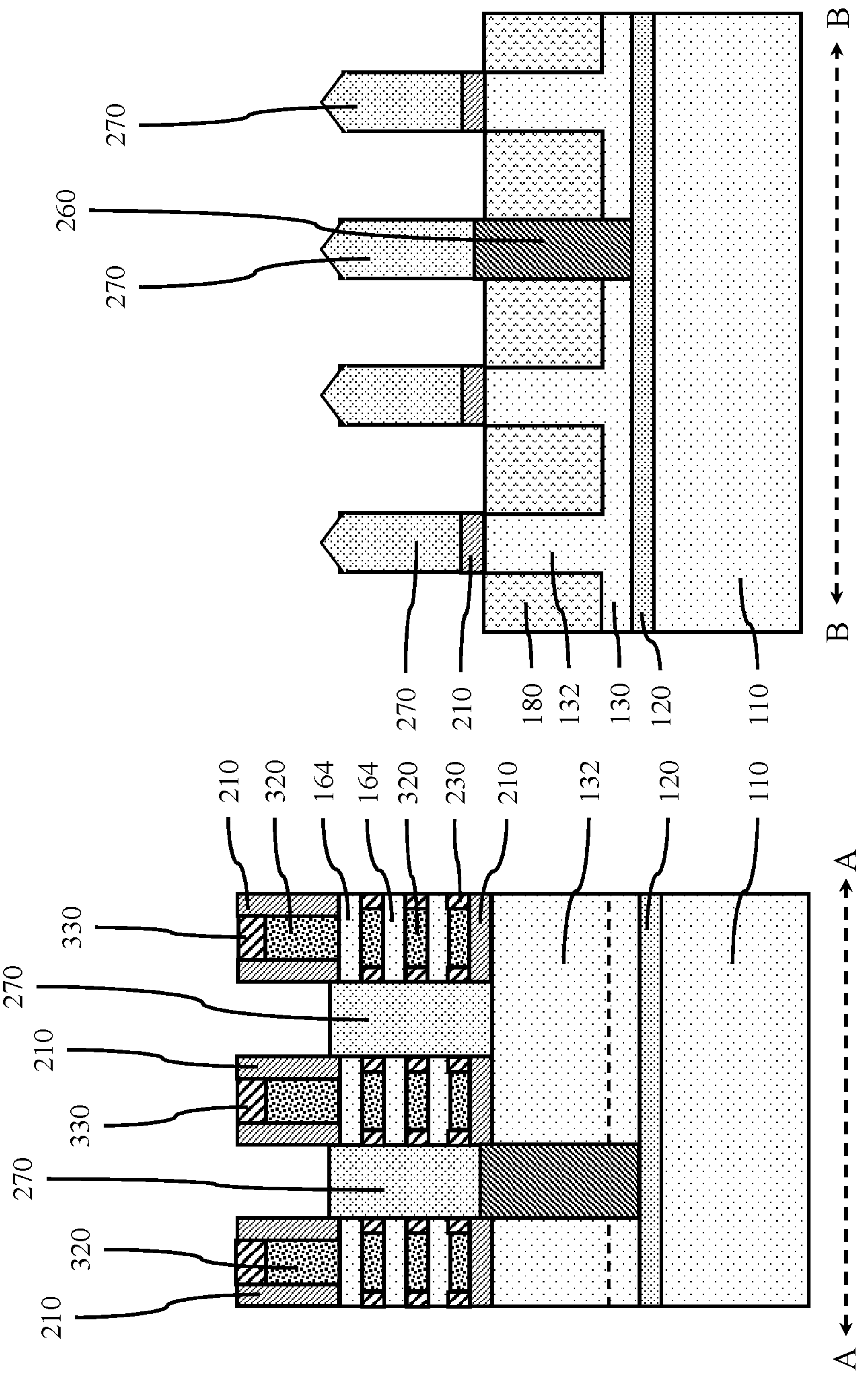
FIG. 18 shows perpendicular cross-sectional side views with the removal of the ILD layer, liner layer, protective spacers, and a portion of the gate cap, in accordance with an embodiment of the present invention.

FIG. 18 includes perpendicular cross-sectional side views showing removal of the ILD layer, liner layer, protective spacers, and a portion of the gate cap, in accordance with an embodiment of the present invention.

In one or more embodiments, the interlayer dielectric (ILD) layer 310 can be removed. The portion of the interlayer dielectric (ILD) layer 310 can be removed using a selective isotropic etch. Removing the ILD layer 310 can expose at least a portion of the liner layer 300.

In one or more embodiments, the liner layer 300 can be removed using a selective etch.

Figure 19:
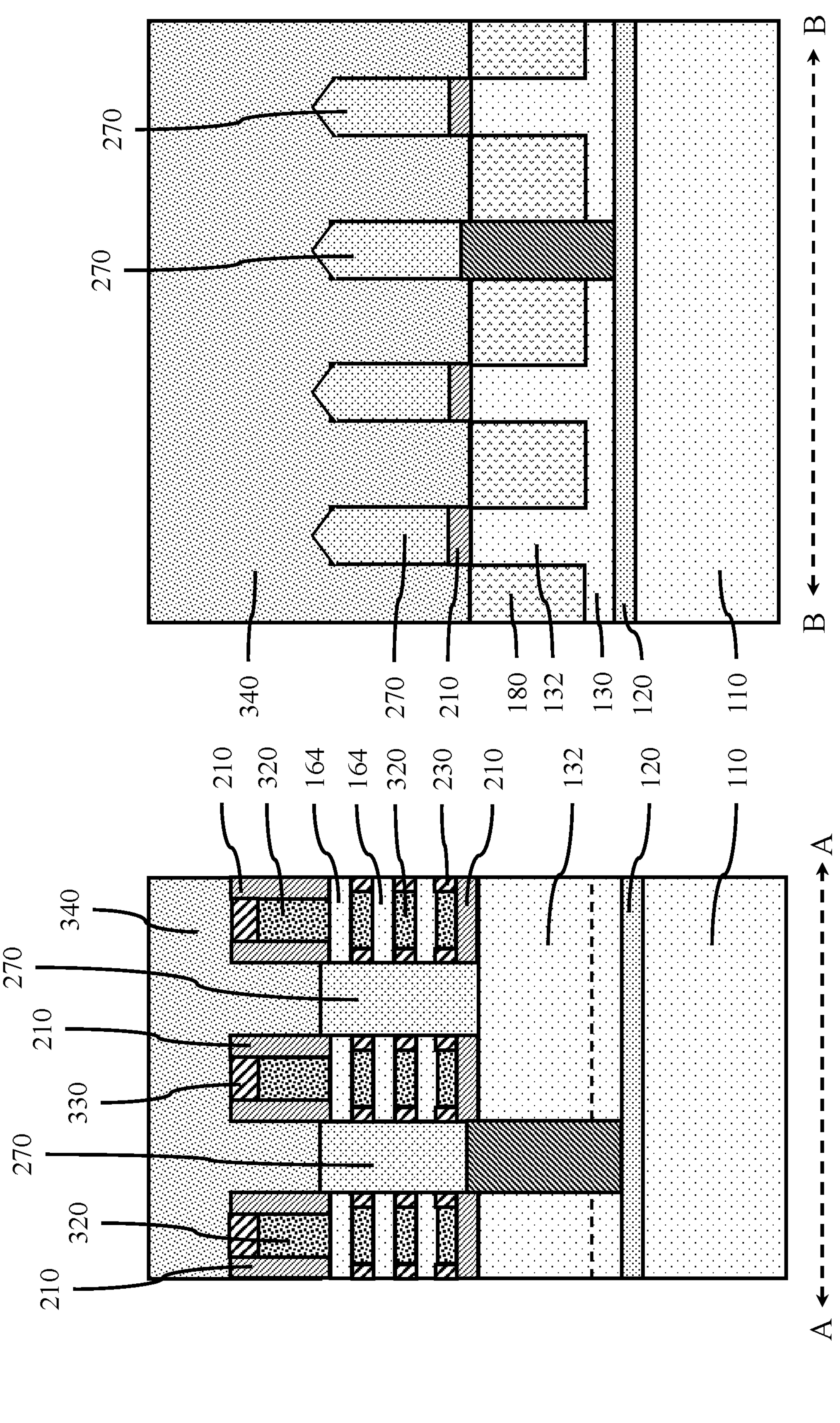
FIG. 19 shows perpendicular cross-sectional side views having a conductive fill layer formed on the source/drains, in accordance with an embodiment of the present invention.

FIG. 19 includes perpendicular cross-sectional side views showing formation of a conductive fill layer on the source/drains, in accordance with an embodiment of the present invention.

In one or more embodiments, a conductive fill layer 340 can be formed on the exposed surfaces of the source/drains 270, shallow trench isolation regions 180, and gate caps 330. The conductive fill layer 340 can be formed on the source/drains 270 by a blanket deposition.

In various embodiments, the upper wrap-around source/drain contacts 345 and recessed wrap-round contact 343 can be on the top sides of the source/drains 270.

In various embodiments, the conductive fill layer 340 comprises a silicide liner, such as Ti, Ni, NiPt, a metal adhesion layer such as TiN, and conductive metal fills, such as W, Ru, or Co.

Figure 20:
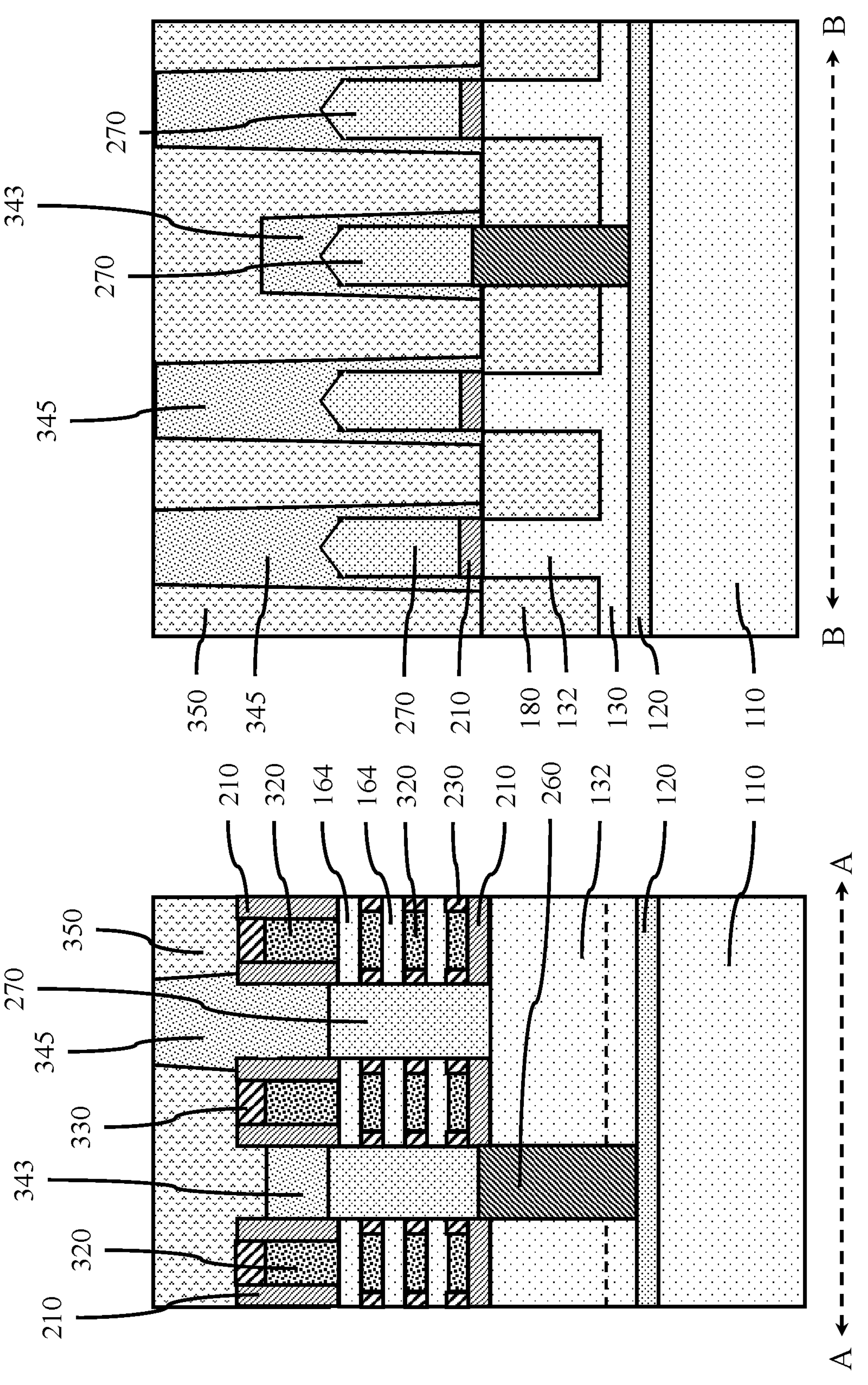
FIG. 20 shows perpendicular cross-sectional side views having the conductive fill layer patterned to form frontside recessed wrap-around source/drain contacts on the source/drains, and formation of a dielectric fill layer on the source/drain contacts, in accordance with an embodiment of the present invention.

FIG. 20 includes perpendicular cross-sectional side views showing patterning of the conductive fill layer to form upper wrap-around source/drain contacts on the source/drains, and formation of a dielectric fill layer on the source/drain contacts, in accordance with an embodiment of the present invention.

In one or more embodiments, the conductive fill layer 340 can be patterned using lithography and selective etching to form upper wrap-around source/drain contacts 345 on all source/drain regions. A mask layer can be applied to open some of the source/drain regions which are wired to backside power distribution network, followed by metal recess to form recessed wrap-around contact 343.

In one or more embodiments, one or more upper wrap-around source/drain contacts 345 and recessed wrap-around contact 343 form electrical connections to the source/drains 270.

In one or more embodiments, a second interlayer dielectric (ILD) layer 350 can be formed on the upper wrap-around source/drain contacts 345 and recessed wrap-around contact 343, source/drains 270, remaining portions of the insulating dielectric sidewalls 210, gate caps 330, shallow trench isolation regions 180, and replacement metal gate structures 320, where the second ILD layer 350 can be formed by a blanket deposition (e.g., chemical vapor deposition (CVD)). The second interlayer dielectric (ILD) layer 350 can fill in the spaces between the insulating dielectric sidewalls 210 and above the source/drains 270 and shallow trench isolation regions 180, where the second interlayer dielectric (ILD) layer 350 can extend above the gate caps 330.

In various embodiments, the second interlayer dielectric (ILD) layer 350 can be an electrically insulating dielectric layer, for example, silicon oxide ($SiO_x$). In various embodiments, the second interlayer dielectric (ILD) layer 350 can be planarized using a chemical-mechanical polishing (CMP) to provide a smooth, flat surface.

Figure 21:
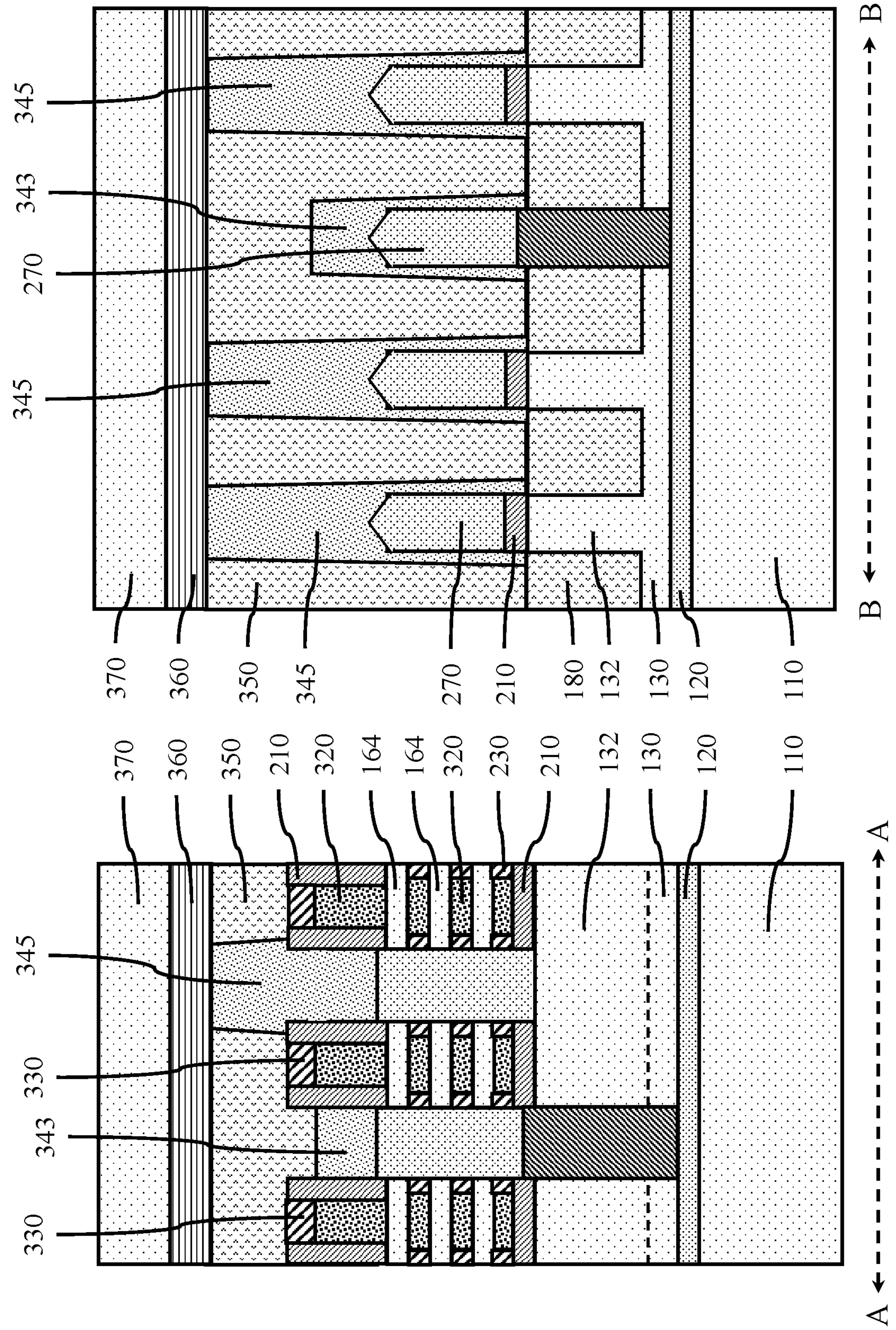
FIG. 21 shows perpendicular cross-sectional side views with a back-end-of-line (BEOL) interconnect layer on the dielectric fill layer and source/drain contacts, and a carrier layer on the BEOL interconnect layer, in accordance with an embodiment of the present invention.

FIG. 21 includes perpendicular cross-sectional side views showing a back-end-of-line (BEOL) interconnect layer on the dielectric fill layer and source/drain contacts, and a carrier layer on the BEOL interconnect layer, in accordance with an embodiment of the present invention.

In one or more embodiments, a back-end-of-line (BEOL) interconnect layer 360 can be formed on the second ILD layer 350, where the BEOL Interconnect layer 360 can include additional metal lines and vias for electrical connections to the upper wrap-around source/drain contacts 345.

In one or more embodiments, a carrier layer 370, for example, a semiconductor wafer, can be attached to the top surface of the BEOL Interconnect layer 360, where the carrier layer 370 can be attached through bonding. In various embodiments, the carrier wafer 370 can be a semiconductor wafer having a thickness sufficient to transfer and transport the attached substrate 110 and intervening layers and features.

Figure 22:
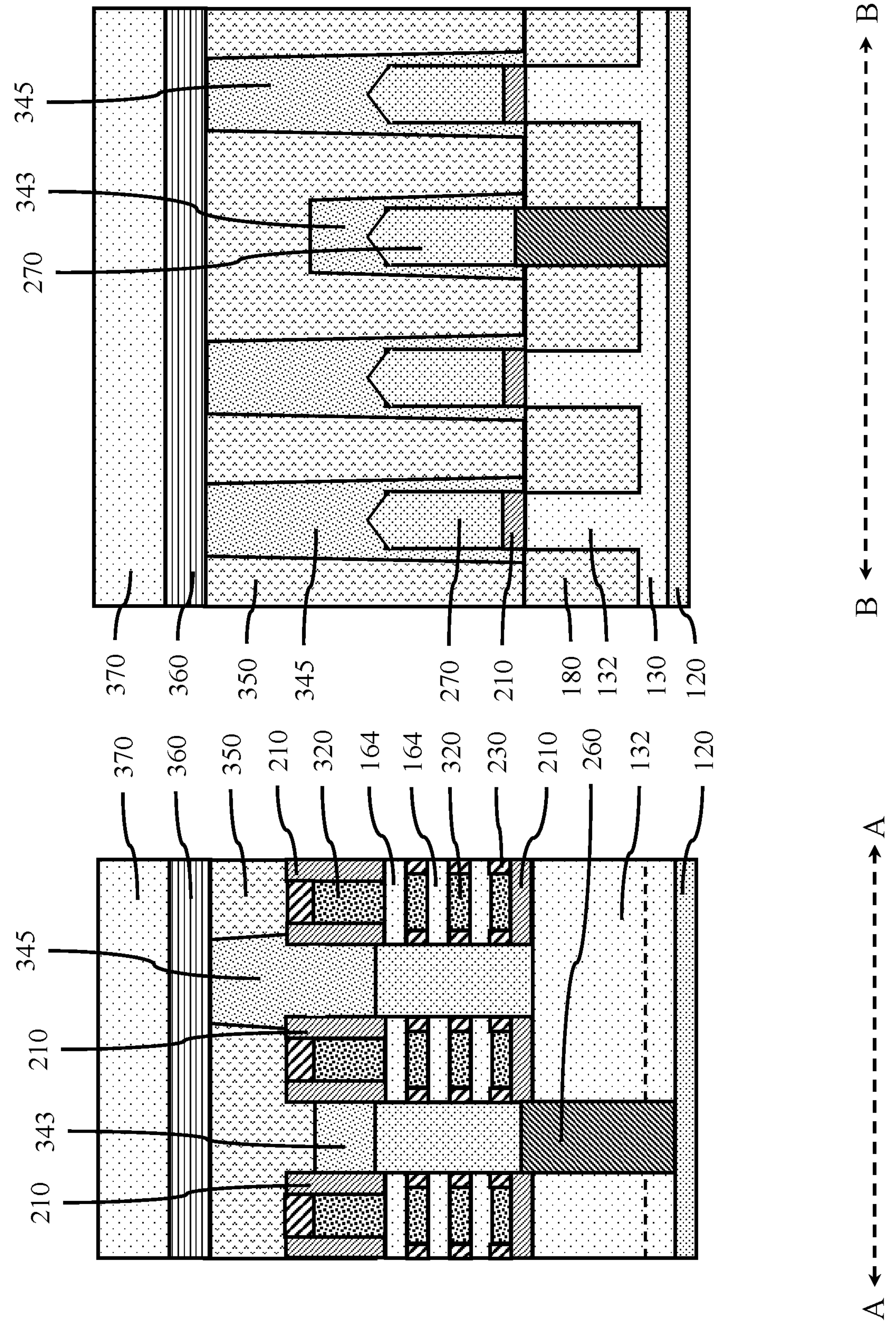
FIG. 22 shows perpendicular cross-sectional side views with the removal of the substrate, in accordance with an embodiment of the present invention.

FIG. 22 includes perpendicular cross-sectional side views showing removal of the substrate, in accordance with an embodiment of the present invention.

In one or more embodiments, the wafer is flipped, and after that, the substrate 110 can be removed, for example, using a combination of wafer grinding, CMP and/or selective etching (e.g., wet chemical etch) to expose the buried etch-stop layer 120, where the buried etch-stop layer 120 is etch-selective to the substrate material.

In one or more embodiments, the substrate 110 with the bonded carrier layer 330 can be flipped 180 degrees (i.e., inverted), so the bottom surface of the substrate 110 becomes the top working surface, and the carrier layer 320 becomes the support for the substrate 110 and the intervening layers and devices.

Figure 23:
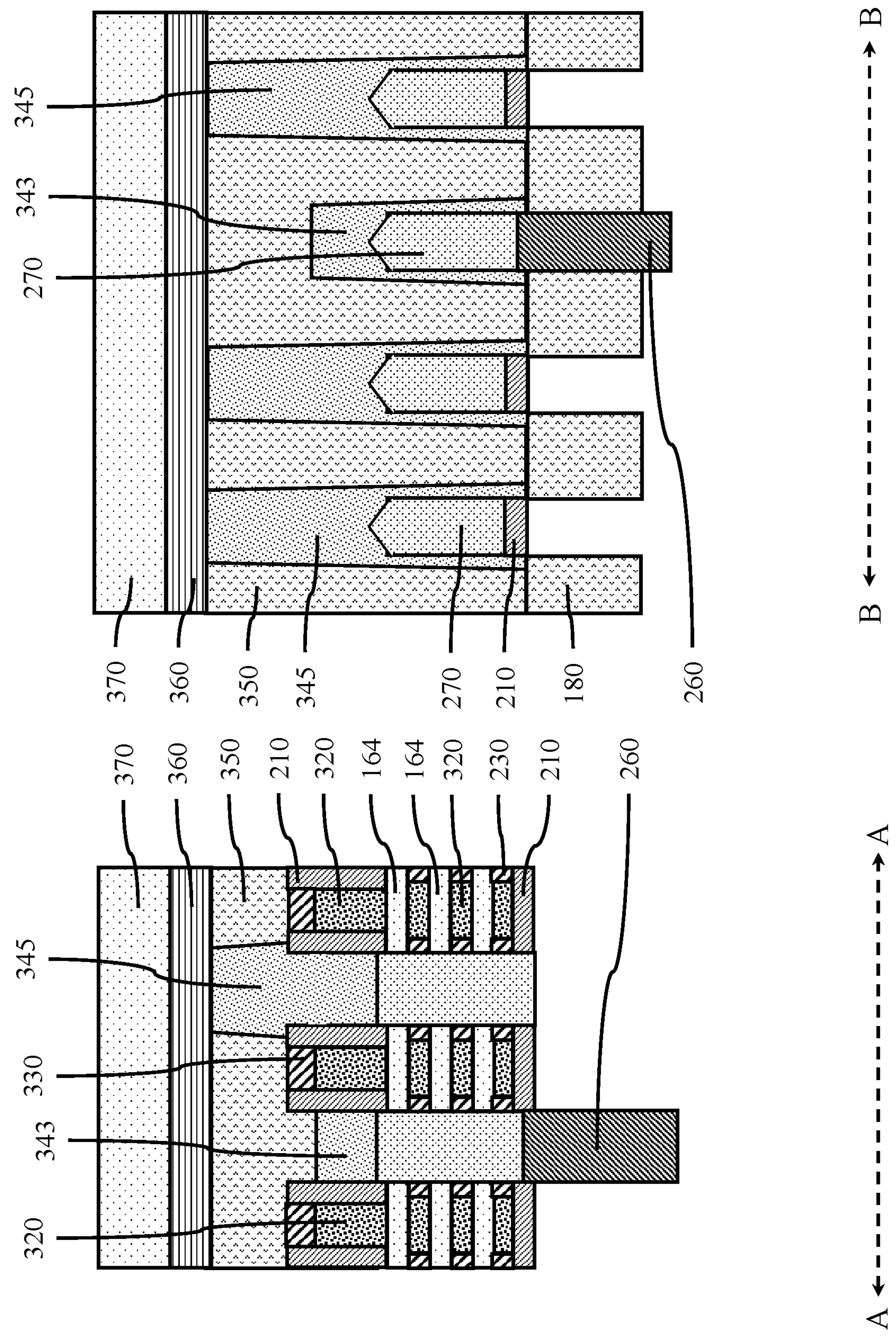
FIG. 23 shows perpendicular cross-sectional side views with the removal of the etch-stop layer, and semiconductor mesa segments to expose the sacrificial plugs, in accordance with an embodiment of the present invention.

FIG. 23 includes perpendicular cross-sectional side views showing removal of the etch-stop layer, and semiconductor mesa segments to expose the sacrificial plugs, in accordance with an embodiment of the present invention.

In one or more embodiments, the buried etch-stop layer 120, remaining active semiconductor mesas 132 and active semiconductor layer 130 can be removed by selective etching, where the removal of the remaining active semiconductor mesas 132 and active semiconductor layer 130 can expose the sacrificial plug 260, buried insulating layer 210, shallow trench isolation regions 180, and bottom surfaces of the source/drains 270 that are not covered by the sacrificial plug(s) 260.

Figure 24:
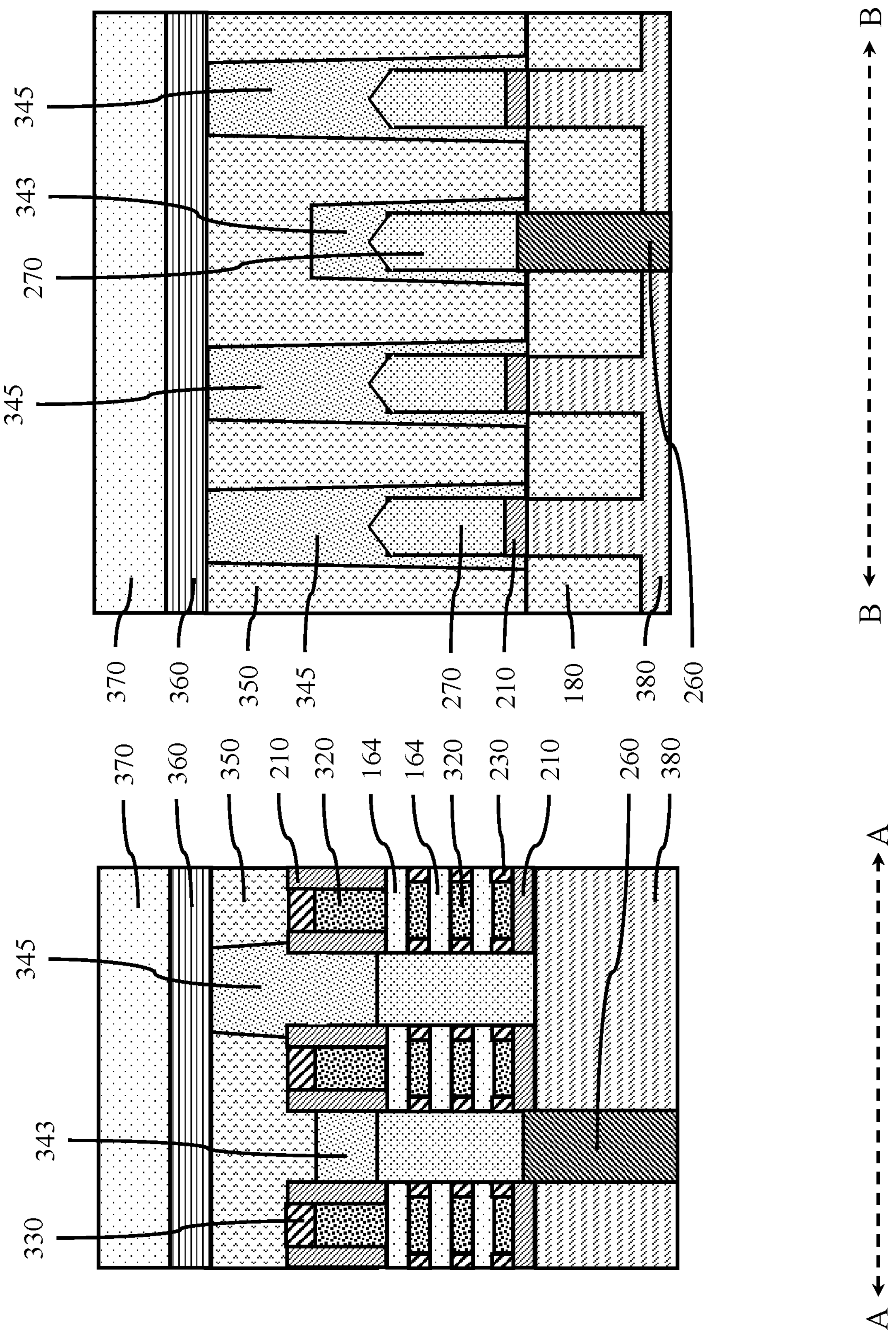
FIG. 24 shows perpendicular cross-sectional side views having a backside ILD layer formed on the shallow trench isolation regions and sacrificial plugs, in accordance with an embodiment of the present invention.

FIG. 24 includes perpendicular cross-sectional side views showing formation of backside ILD layer on the shallow trench isolation regions and sacrificial plugs, in accordance with an embodiment of the present invention.

In one or more embodiments, backside ILD layer 380 can be formed on the exposed shallow trench isolation regions 180, sacrificial plug(s) 260, and buried insulating layer 210. In various embodiments, the backside ILD layer 380 can be an electrically insulating, dielectric material (e.g., $SiO_x$) formed by a blanket deposition (e.g., CVD).

Figure 25:
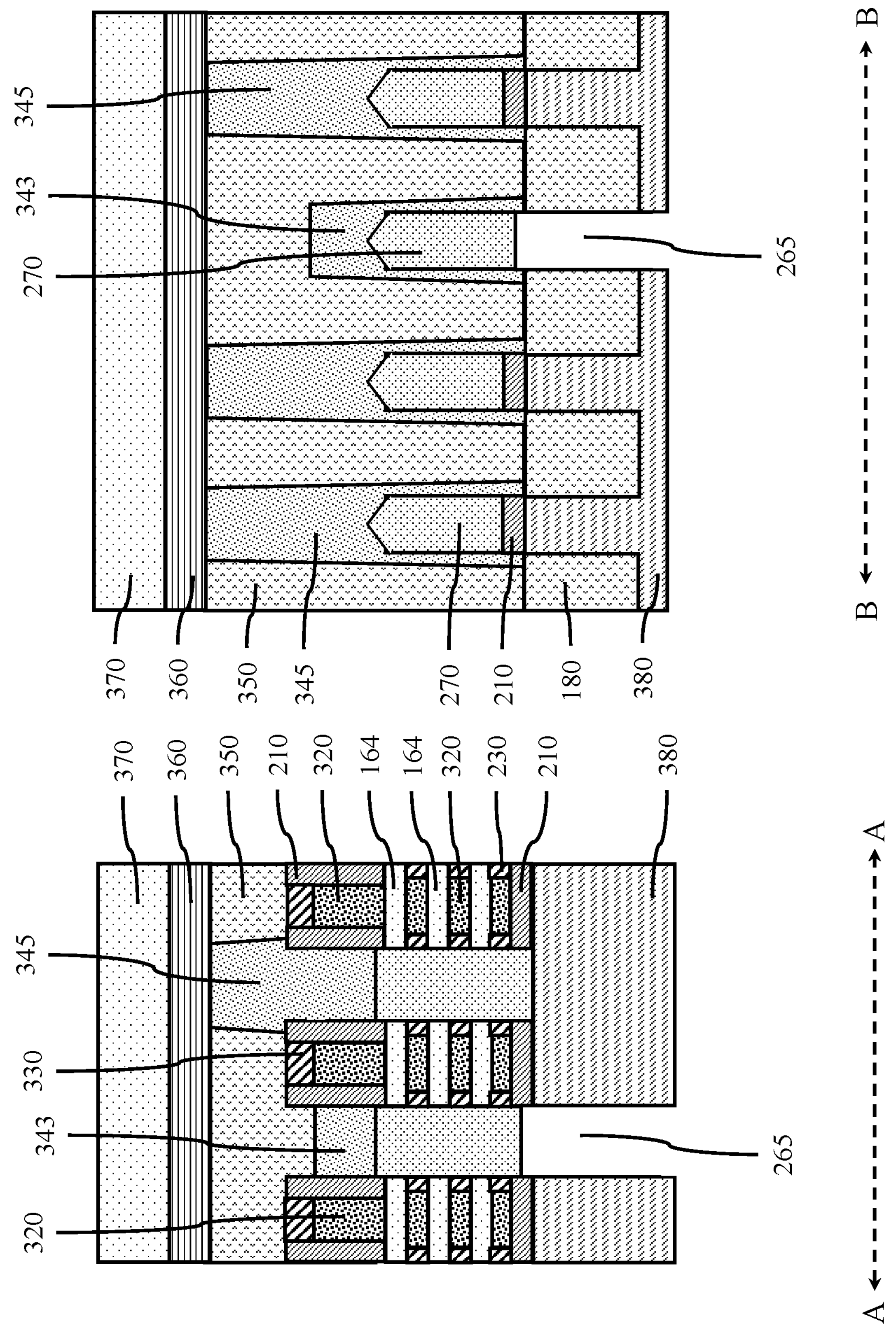
FIG. 25 shows perpendicular cross-sectional side views with the removal of the sacrificial plugs to form contact trenches that expose a backside of the source/drains, in accordance with an embodiment of the present invention.

FIG. 25 includes perpendicular cross-sectional side views showing removal of the sacrificial plugs to form contact trenches that expose a backside of the source/drains, in accordance with an embodiment of the present invention.

In one or more embodiments, the sacrificial plugs 260 can be removed, for example, using a selective isotropic etch to form openings 265 expose the sidewalls of the backside ILD layer 380 and backside of the source/drains 270. In various embodiments, edges of the buried insulating layer 210 adjoining the sacrificial plugs 260 can become exposed with removal of the sacrificial plugs 260.

Figure 26:
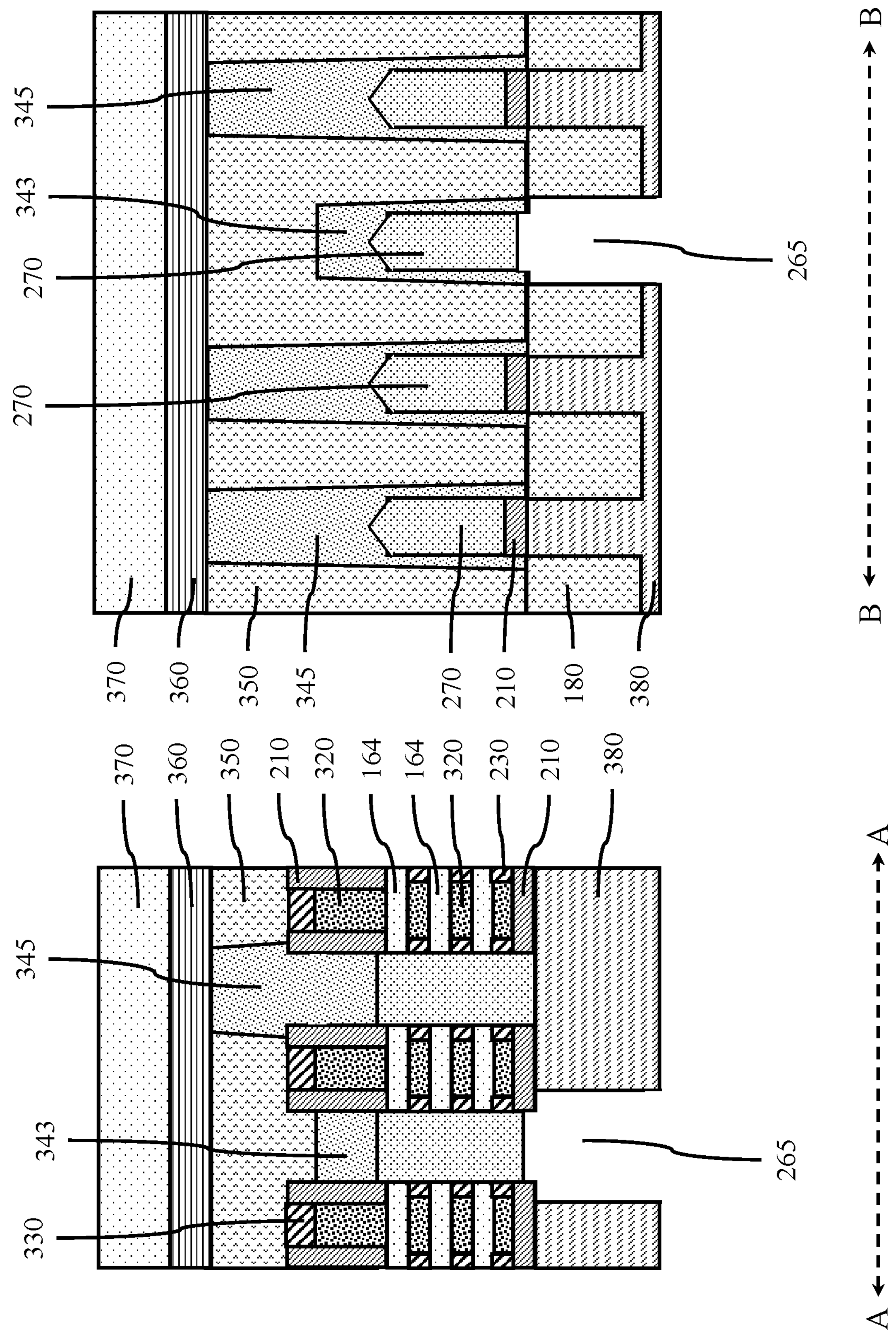
FIG. 26 shows perpendicular cross-sectional side views with the removal of a portion of the shallow trench isolation regions and backside ILD to widen the contact trenches, in accordance with an embodiment of the present invention.

FIG. 26 includes perpendicular cross-sectional side views showing removal of a portion of the shallow trench isolation regions and backside ILD to widen the contact trenches, in accordance with an embodiment of the present invention.

In one or more embodiments, a selective isotropic etch can be used to increase the size of the openings 265 in the backside ILD layer 380 formed by removal of the sacrificial plugs 260 and decrease the thickness of the backside ILD layer 380 on the buried insulating layer 210, where removal of the additional portion of the backside ILD layer 380 can expose the surfaces of the buried insulating layer 210, and the recessed wrap around contact 343.

Figure 27:
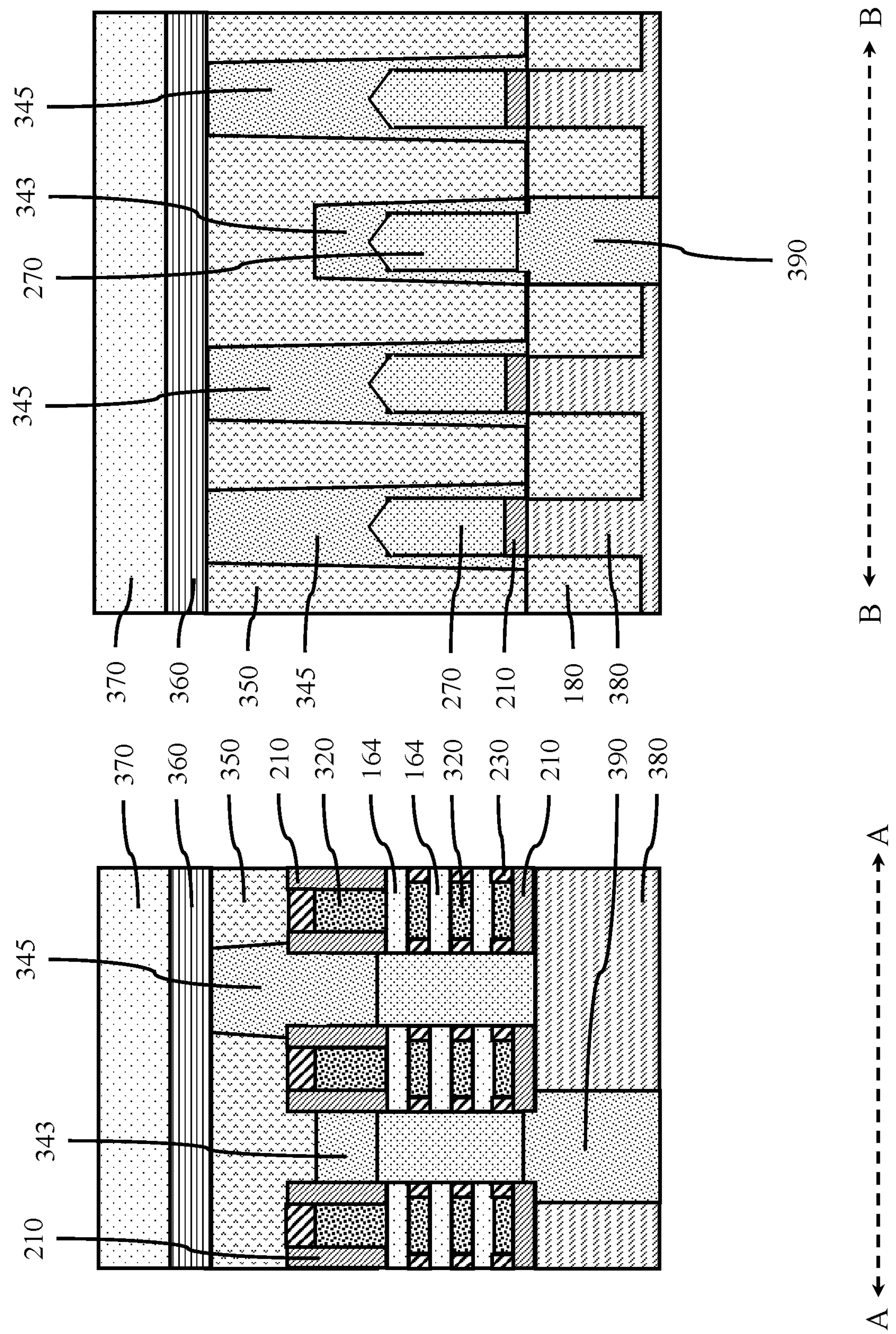
FIG. 27 shows perpendicular cross-sectional side views having backside conductive contacts formed in the contact trenches, in accordance with an embodiment of the present invention.

FIG. 27 includes perpendicular cross-sectional side views showing formation of the backside conductive contacts in the contact trenches, in accordance with an embodiment of the present invention.

In one or more embodiments, backside conductive contacts 390 can be formed in the openings 265, where the backside conductive contacts 390 can be formed by a blanket deposition (e.g., CVD) followed by a CMP to provide a smooth, flat surface. The backside conductive contact(s) 390 can be on and in electrical contact with the source/drain(s) 270 and the recessed wrap around contact 343, which can form a full wrap-around contact surrounding at least a partial length of the source/drain(s) 270. In various embodiments, the backside conductive contacts 390 can be in direct contact with the recessed wrap around contact 343 to form a full wrap-around source/drain contact.

In various embodiments, the backside conductive contacts 390 can be a metal, for example, a silicide liner, such as Ti, Ni, NiPt, a metal adhesion layer, such as, TiN, and conductive metal fills such as, W, Ru, or Co, where the backside conductive contacts 390 can be the same material as the upper wrap-around source/drain contacts 345 and recessed wrap around contact 343.

Figure 28:
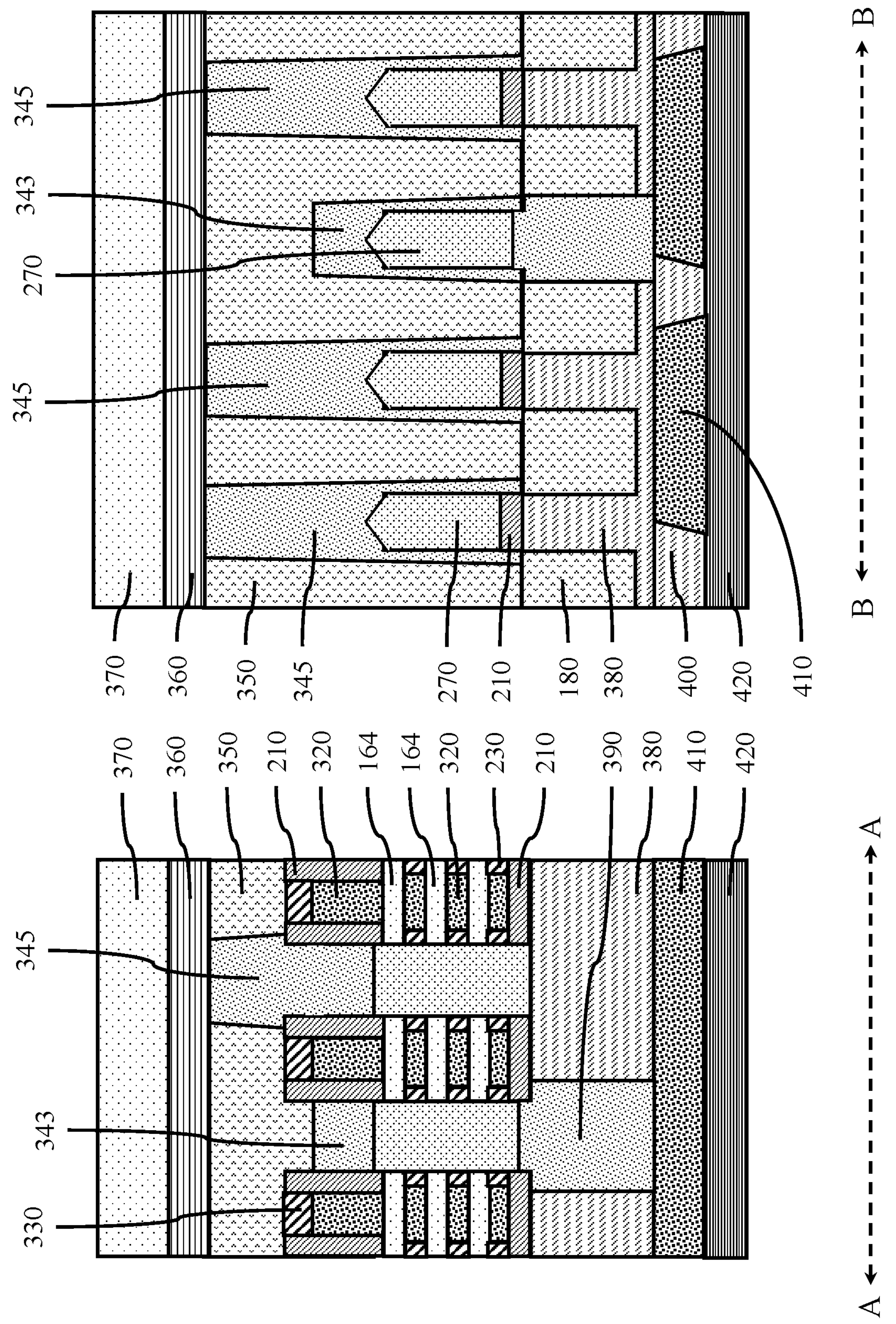
FIG. 28 shows perpendicular cross-sectional side views having a backside power rail and backside power delivery network (BSPDN) formed to the backside conductive contacts, in accordance with an embodiment of the present invention.

FIG. 28 are perpendicular cross-sectional side views showing formation of the backside power rail and backside power delivery network (BSPDN) to the backside conductive contacts, in accordance with an embodiment of the present invention. In one or more embodiments, a backside dielectric fill layer 400 can be formed on the backside ILD layer 380 and backside conductive contacts 390, where the dielectric fill layer 400 can be formed by a blanket deposition. The backside dielectric fill layer 390 can cover the backside ILD layer 380 and the shallow trench isolation regions 180. In various embodiments, the backside dielectric fill layer 390 can be an electrically insulating dielectric material, for example, silicon oxide ($SiO_x$).

In one or more embodiments, one or more backside power rails 410 can be formed in the backside dielectric fill layer 400, where the backside power rails 410 can be formed through masking, lithography, etching and metal deposition. The backside power rails 410 can be on and in electrical contact with the backside conductive contacts 390.

In one or more embodiments, a backside power delivery network (BSPDN) 420 can be formed on and to the backside power rails 410 and on the backside dielectric fill layer 400, where a backside power rail 410 can connect to a backside conductive contact 390 to provide a voltage/current to the source/drains 270 through the full wrap-around source/drain contacts.

The wrap around contact with full height 345 goes to BEOL at frontside.

The wrap around contact with reduced height 343 combines with backside contact, and goes to backside power rail and BSPDN.

The size of the backside contact is widened, such that it can connect to the sidewall metals of 343, and BDI layer prevents the widened backside contact from shorting to gate.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to “one embodiment” or “an embodiment”, as well as other variations thereof, means that a particular feature, structure, characteristic, and so forth described in connection with the embodiment is included in at least one embodiment. Thus, the appearances of the phrase “in one embodiment” or “in an embodiment”, as well any other variations, appearing in various places throughout the specification are not necessarily all referring to the same embodiment.

It is to be appreciated that the use of any of the following “/”, “and/or”, and “at least one of”, for example, in the cases of “A/B”, “A and/or B” and “at least one of A and B”, is intended to encompass the selection of the first listed option (A) only, or the selection of the second listed option (B) only, or the selection of both options (A and B). As a further example, in the cases of “A, B, and/or C” and “at least one of A, B, and C”, such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

It will also be understood that when an element such as a layer, region or substrate is referred to as being “on” or “over” another element, it can be directly on the other element or intervening elements can also be present. In contrast, when an element is referred to as being “directly on” or “directly over” another element, there are no intervening elements present. It will also be understood that when an element is referred to as being “connected” or “coupled” to another element, it can be directly connected or coupled to the other element or intervening elements can be present. In contrast, when an element is referred to as being “directly connected” or “directly coupled” to another element, there are no intervening elements present.

The terminology used herein is for the purpose of describing particular embodiments only and is not intended to be limiting of example embodiments. As used herein, the singular forms “a.” “an” and “the” are intended to include the plural forms as well, unless the context clearly indicates otherwise. It will be further understood that the terms “comprises,” “comprising,” “includes” and/or “including,” when used herein, specify the presence of stated features, integers, steps, operations, elements and/or components, but do not preclude the presence or addition of one or more other features, integers, steps, operations, elements, components and/or groups thereof.

Spatially relative terms, such as “beneath,” “below,” “lower,” “above,” “upper,” and the like, can be used herein for ease of description to describe one element’s or feature’s relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:

a source/drain disposed between adjacent gate structures, the source/drain having a front side, a back side opposite the front side, opposite sides extending between the front side and the back side, and a length extending between the adjacent gate structures; and a full wrap-around contact on the front side, the back side, and the opposite sides of the source/drain and surrounding the source/drain along at least a portion of the length of the source/drain, wherein the full wrap-around contact includes a frontside recessed wrap-around contact on the front side and the opposite sides of the source/drain, and a backside conductive contact on the back side of the source/drain and in direct contact with the frontside recessed wrap-around contact.

2. The semiconductor device of claim 1, wherein the frontside recessed wrap-around contact and the backside conductive contact have at least one conductive material in common.

3. The semiconductor device of claim 2, further comprising one or more semiconductor nanosheet layers adjoining a face of the source/drain.

4. The semiconductor device of claim 3, further comprising a metal-silicide layer, wherein a portion of the metal-silicide layer separates the frontside recessed wrap-around contact from the source/drain.

5. The semiconductor device of claim 4, further comprising a backside power rail on and in electrical contact with the backside conductive contact.

6. The semiconductor device of claim 5, wherein the backside conductive contact is directly on the source/drain and the frontside recessed wrap-around contact.

7. The semiconductor device of claim 6, wherein the adjacent gate structures are on the one or more semiconductor nanosheet layers, and a buried dielectric insulating layer separates the adjacent gate structures from the backside conductive contact.

8. The semiconductor device of claim 1, wherein the frontside recessed wrap-around contact comprises sidewall metals, and wherein the backside conductive contact includes a laterally extending portion in direct contact with the sidewall metals.

9. The semiconductor device of claim 1, further comprising a backside dielectric fill layer on the backside conductive contact, and a backside power rail in the backside dielectric fill layer, wherein the backside power rail is on and in electrical contact with the backside conductive contact.

10. The semiconductor device of claim 1, wherein the adjacent gate structures are replacement metal gate structures, and further comprising inner spacers between the source/drain and the replacement metal gate structures, the inner spacers electrically separating the source/drain from the replacement metal gate structures.

11. A backside power connection device, comprising:

a backside power rail on a backside power delivery network;

a backside interlayer dielectric layer on the backside power rail and the backside power delivery network;

a backside conductive contact in the backside interlayer dielectric layer, wherein the backside conductive contact is in electrical contact with the backside power rail;

a first source/drain having a top side, a back side opposite the top side, and opposite sides extending between the top side and the back side, the back side of the first source/drain being on the backside conductive contact; and a first frontside recessed wrap-around contact on the top side and the opposite sides of the first source/drain, wherein the backside conductive contact is in direct contact with the first frontside recessed wrap-around contact.

12. The backside power connection device of claim 11, further comprising a second source/drain having a top side, a back side opposite the top side, and opposite sides extending between the top side and the back side, the back side of the second source/drain being on the backside interlayer dielectric layer.

13. The backside power connection device of claim 12, further comprising nanosheet layer segments adjoining the first source/drain and the second source/drain.

14. The backside power connection device of claim 12, further comprising a second frontside recessed wrap-around contact on the top side and the opposite sides of the second source/drain, and a back-end-of-line interconnect layer on and in electrical contact with the second frontside recessed wrap-around contact.

15. The backside power connection device of claim 11, further comprising adjacent gate structures and a buried dielectric insulating layer, wherein the first source/drain is disposed between the adjacent gate structures, and wherein the buried dielectric insulating layer separates the adjacent gate structures from the backside conductive contact.

16. The backside power connection device of claim 11, further comprising a metal-silicide layer, wherein a portion of the metal-silicide layer separates the first frontside recessed wrap-around contact from the first source/drain.

17. The backside power connection device of claim 11, wherein the backside conductive contact and the first frontside recessed wrap-around contact together form a full wrap-around contact.

18. The backside power connection device of claim 11, wherein the first frontside recessed wrap-around contact comprises sidewall metals, and wherein the backside conductive contact includes a laterally extending portion in direct contact with the sidewall metals.

19. The backside power connection device of claim 11, wherein the backside conductive contact and the first frontside recessed wrap-around contact have at least one conductive material in common.

20. The backside power connection device of claim 11, further comprising an interlayer dielectric layer on the first frontside recessed wrap-around contact, and a back-end-of-line interconnect layer on the interlayer dielectric layer.

* * * * *